(12) United States Patent
Ker et al.

(10) Patent No.: US 7,436,041 B2
(45) Date of Patent: Oct. 14, 2008

(54) ELECTROSTATIC DISCHARGE PROTECTION CIRCUIT USING A DOUBLE-TRIGGERED SILICON CONTROLLING RECTIFIER

(75) Inventors: Ming-Dou Ker, Hsinchu (TW); Kuo-Chun Hsu, Miaoli County (TW)

(73) Assignee: National Chiao Tung University, Hsinchu (TW)

( * ) Notice: Subject to any disclaimer, the term of this patent is extended or adjusted under 35 U.S.C. 154(b) by 503 days.

(21) Appl. No.: 11/306,212

(22) Filed: Dec. 20, 2005

(65) Prior Publication Data

US 2008/0054297 A1    Mar. 6, 2008

Related U.S. Application Data

(62) Division of application No. 10/709,307, filed on Apr. 28, 2004, now Pat. No. 7,071,528.

(30) Foreign Application Priority Data

Dec. 18, 2003   (TW) ............................... 92135908 A

(51) Int. Cl.
    *H01L 23/58*   (2006.01)

(52) U.S. Cl. .................. 257/492; 257/355; 257/356; 257/373; 257/339; 257/493; 361/111

(58) Field of Classification Search ............. 257/118, 257/244, 328–333, 466, 513, 594; 438/242, 438/268–274; 360/56, 111
    See application file for complete search history.

(56) References Cited

U.S. PATENT DOCUMENTS 6,433,979 B1 *  8/2002  Yu ............................ 361/56
6,858,901 B2 *  2/2005  Ker et al. ................ 257/360

* cited by examiner

*Primary Examiner*—M. Wilczewski
*Assistant Examiner*—Tsz K Chiu
(74) *Attorney, Agent, or Firm*—Jianq Chyun IP Office

(57) ABSTRACT

An ESD protection circuit using a double-triggered silicon controller rectifier (SCR). The double-triggered silicon controller rectifier (SCR) includes N+ diffusion areas, P+ diffusion areas, a first N-well region, a second N-well region and a third N-well region formed in a P-substrate. The N+ diffusion areas and the P+ diffusion areas are isolated by shallow trench isolation (STI) structures. Two of the N+ diffusion areas are N-type trigger terminals. Two of the P+ diffusion areas are the P-type trigger terminal.

7 Claims, 25 Drawing Sheets

ELECTROSTATIC DISCHARGE PROTECTION CIRCUIT USING A DOUBLE-TRIGGERED SILICON CONTROLLING RECTIFIER

CROSS-REFERENCE TO RELATED APPLICATION

This application is a divisional application of application Ser. No. 10/709,307, filed on Apr. 28, 2004, now allowed, which claims the priority benefit of Taiwan application serial no. 92135908, filed on Dec. 18, 2003. All disclosures are incorporated herewith by reference

BACKGROUND OF THE INVENTION

1. Field of the Invention

The present invention relates to an electrostatic discharge (ESD) protection circuit using a double-triggered silicon controlling rectifier (DT_SCR), and more particularly to an electrostatic discharge circuit using a double-triggered silicon controlling rectifier with low-switching voltage and high-trigger speed.

2. Description of the Related Art

During the development of the semiconductor technology, electrostatic discharge (ESD) protection circuit is an essential component for integrated circuits. Especially for deep sub-micron semiconductor technology, the gate thickness and the chip size are shrunk making device easily vulnerable to ESD damage. Therefore, ESD protection circuits are usually applied to input/output (I/O) pads for preventing internal circuits from ESD damage.

FIG. 1A is a configuration showing a conventional silicon controlling rectifier. The conventional silicon controlling rectifier shown in FIG. 1A is widely used in ESD circuits because of its excellent performance. The conventional silicon controlling rectifier comprises: a N-well region 103, a N+ diffusion area 109 and a P+ diffusion area 111 in a P-type substrate 101. The N+ diffusion area 109 of the silicon controlling rectifier serves as a cathode 117, and the P+ diffusion area 111 is grounded. A N+ diffusion area 107 and a P+ diffusion area 108 are formed within the N-well region 103. The P+ diffusion area 108 serves as an anode 115 of the silicon controlling rectifier, and the N+ diffusion area 107 is coupled to the external power terminal VDD. The diffusion areas are isolated by shallow trench isolation (STI). In detail, the N+ diffusion area 107 and the P+ diffusion area 108 are isolated by STIs 119, 121 and 123. The N+ diffusion area 109 and the P+ diffusion area 111 are isolated by STIs 123, 125 and 127.

FIG. 1B is an equivalent circuit of the conventional silicon controlling rectifier shown in FIG. 1A. Referring to FIG. 1B, the transistor Q1 is a PNP bipolar transistor formed from the N+ diffusion areas 107 and 108 and the P+ diffusion area 111, and R1 is the equivalent resistor between the N+ diffusion area 107 and the N-well region 103. The transistor Q2 is a NPN bipolar transistor formed from the N+ diffusion areas 107 and 109 and the P+ diffusion area 111, and R2 is the equivalent resistor between the P+ diffusion area 111 and the P-type substrate 101. When a positive ESD voltage is coupled to the circuit, avalanche breakdown occurs at the interface between the collector/base of the transistor Q1. The transistor Q2 turns on and regenerative conduction action arises so that the ESD charges are introduced to the ground terminal. When a negative ESD voltage is coupled to the circuit, forward-bias occurs at the interface between the collector/base of the transistor Q1, and the ESD charges are introduced to the ground terminal.

Although the silicon controlling rectifier has excellent performance for preventing damage due to ESD pulses, the switch voltage of the device is larger than the breakdown voltage of the gate oxide layer. Accordingly, the conventional silicon controlling rectifier cannot effectively protect the internal circuit from the ESD damage.

SUMMARY OF THE INVENTION

Therefore, one object of the present invention is to provide a double-triggered silicon controlling rectifier for low-switching voltage and high-triggering speed so as to serve as an electrostatic discharge device.

In accordance with the object described above, the present invention discloses a double-triggered silicon controlling rectifier, comprising a P-type substrate, a plurality of N+ diffusion areas, a plurality of P+ diffusion areas, a plurality of isolation structures, a first, a second and a third N-well regions. The first, the second and the third N-well regions are all formed within the P-type substrate. The second and the third N-well regions are formed on each side of the first N-well region, opposite to the each other. The plurality of N+ diffusion areas comprises: a first N+ diffusion area, formed in the first N-well region and coupled to an external power terminal; a second N+ diffusion area, formed in the first N-well region and on one side of the first N+ diffusion area, as a N-type trigger terminal of the double-triggered silicon controlling rectifier; a third N+ diffusion area, formed in the first N-well region and on another side of the first N+ diffusion area, opposite to the second N+ diffusion area as the N-type trigger terminal of the double-triggered silicon controlling rectifier; a fourth N+ diffusion area, partially formed in the third N-well region and partially formed in the P-type substrate, and on one side of the second N+ diffusion region, opposite to the first N+ diffusion region as a cathode of the double-triggered silicon controlling rectifier; and a fifth N+ diffusion, partially formed in the third N-well region and partially formed in the P-type substrate, and on one side of the third N+ diffusion region, opposite to the first N+ diffusion region as the cathode of the double-triggered silicon controlling rectifier. The plurality of P+ diffusion areas comprises: a first P+ diffusion area, formed within the first N-well region and between the first N+ diffusion area and the second N+ diffusion area, as an anode of the double-triggered silicon controlling rectifier; a second P+ diffusion area, formed within the first N-well region and between the first N+ diffusion area and the third N+ diffusion area, as the anode of the double-triggered silicon controlling rectifier; a third P+ diffusion area, formed within the P-type substrate between the first and the third N-well regions, and between the second and the fourth N+ diffusion areas, as a P-type trigger terminal of the double-triggered silicon controlling rectifier; a fourth P+ diffusion area, formed within the P-type substrate between the first and the second N-well regions, and between the third and the fifth N+ diffusion areas, as the P-type trigger terminal of the double-triggered silicon controlling rectifier; a fifth P+ diffusion area, formed within the P-type substrate and on one side of the fourth N+ diffusion area, opposite to the third P+ diffusion area, as a ground terminal of the double-triggered silicon controlling rectifier; and a sixth P+ diffusion area, formed within the P-type substrate and on one side of the fifth N+ diffusion area, opposite to the fourth P+ diffusion area, as the ground terminal of the double-triggered silicon controlling rectifier. The plurality of isolation structures are formed within the P-type substrate and between spaces of the pluralities of N+ and P+ diffusion areas.

The isolation structures are comprised of shallow trench isolation structures. The depth of the shallow trench isolation is about 0.4 µm for a 0.25-µm complementary metal-oxide-semiconductor (CMOS) process.

Moreover, a portion of the isolation structures comprise a dummy gate terminal and, in the preferred embodiment, the dummy gate terminal is made from polycrystal material.

The depths of the N+ and P+ diffusion areas are about 0.18 µm for a 0.25-µm complementary metal-oxide-semiconductor (CMOS) process.

Another object of the present invention is to provide an electrostatic discharge (ESD) protection circuit using a double-triggered silicon controlling rectifier described above, disposed between an input/output (I/O) pad and an internal circuit thereof.

In order to achieve the object of the present invention, the present invention discloses an ESD protection circuit including a double-triggered silicon controlling rectifier for an integrate circuit, which comprises: a first double-triggered silicon controlling rectifying module, a first electrostatic detecting module, a second double-triggered silicon controlling rectifying module and a second electrostatic detecting module. The first double-triggered silicon controlling rectifying module comprises a first terminal, a second terminal, a N-type trigger terminal and a P-type trigger terminal. The first terminal is coupled to a high-voltage external power terminal and the second terminal is coupled to the I/O pad and the internal circuit of integrate circuit. The first electrostatic detecting module comprises a first output terminal, a second output terminal, a first input terminal and a second input terminal. The first output terminal is coupled to the first N-type trigger terminal, the second output terminal is coupled to the first P-type trigger terminal, the first input terminal is coupled to the high-voltage external terminal, and the second input terminal is coupled to the internal circuit of the integrate circuit and the I/O pad. When a negative ESD voltage attacks the integrated circuit, the ESD protection circuit connected to the I/O pad of the integrated circuit is triggered. Consequently, the first double-triggered silicon controlling rectifying module directs the ESD current from the first N-type trigger terminal to the first electrostatic detecting module and then the first electrostatic detecting module directs the ESD current to the first double-triggered silicon controlling rectifying module through the second output terminal. Similarly, the second double-triggered silicon controlling rectifying module comprises a third terminal, a fourth terminal, a second N-type trigger terminal and a second P-type trigger terminal. The third terminal is coupled to the I/O pad and the internal circuit of the integrate circuit, and the second terminal is coupled to a low-voltage external power terminal. The second electrostatic detecting module comprises a third output terminal, a fourth output terminal, a third input terminal and a fourth input terminal. The third output terminal is coupled to the second N-type trigger terminal, the fourth output terminal is coupled to the second P-type trigger terminal, the third input terminal is coupled to the internal circuit of the integrate circuit and the I/O pad, and the fourth input terminal is coupled to the low-voltage external power terminal. When a positive ESD voltage attacks the integrated circuit, the ESD protection circuit connected to the I/O pad of the integrated circuit is triggered. Consequently, the second double-triggered silicon controlling rectifying module directs the ESD current form the second N-type trigger terminal to the second electrostatic detecting module, and then the second electrostatic detecting module directs the ESD current to the second double-triggered silicon controlling rectifying module through the fourth output terminal.

The first double-triggered silicon controlling rectifying module comprises: a first double-triggered silicon controlling rectifier and a second double-triggered silicon controlling rectifier. The first double-triggered silicon controlling rectifier comprises an anode, a cathode, N-type trigger terminal and the P-type trigger terminal. The anode of the first double-triggered silicon controlling rectifier serves as the first terminal of the first double-triggered silicon controlling rectifying module. The second double-triggered silicon controlling rectifier comprises an anode, cathode, a N-type trigger terminal and a P-type trigger terminal. The anode of the second double-triggered silicon controlling rectifier is coupled to the cathode of the first double-triggered silicon controlling rectifier, the cathode of the second double-triggered silicon controlling rectifier serves as the second terminal of the first double-triggered silicon controlling rectifying module. The N-type trigger terminal of the second double-triggered silicon controlling rectifier is coupled to the N-type trigger terminal of the first double-triggered silicon controlling rectifier and serves as the first N-type trigger terminal of the first double-triggered silicon controlling rectifying module, and the P-type trigger terminal of the second double-triggered silicon controlling rectifier is coupled to the P-type trigger terminal of the first double-triggered silicon controlling rectifier and serves as the first P-type trigger terminal of the first double-triggered silicon controlling rectifying module.

The second double-triggered silicon controlling rectifying module comprises: a third double-triggered silicon controlling rectifier and a fourth double-triggered silicon controlling rectifier. The third double-triggered silicon controlling rectifier comprises an anode, a cathode, a N-type trigger terminal and a P-type trigger terminal. The anode of the third double-triggered silicon controlling rectifier serves as the third terminal of the second double-triggered silicon controlling rectifying module. The fourth double-triggered silicon controlling rectifier comprises an anode, cathode, a N-type trigger terminal and a P-type trigger terminal. The anode of the fourth double-triggered silicon controlling rectifier is coupled to the cathode of the third double-triggered silicon controlling rectifier. The cathode of the fourth double-triggered silicon controlling rectifier serves as the fourth terminal of the second double-triggered silicon controlling rectifying module. The N-type trigger terminal of the fourth double-triggered silicon controlling rectifier is coupled to the N-type trigger terminal of the third double-triggered silicon controlling rectifier and serves as the second N-type trigger terminal of the second double-triggered silicon controlling rectifying module, and the P-type trigger terminal of the fourth double-triggered silicon controlling rectifier is coupled to the P-type trigger terminal of the third double-triggered silicon controlling rectifier and serves as the second P-type trigger terminal of the second double-triggered silicon controlling rectifying module.

The first electrostatic detecting module comprises: a first transistor and a second transistor. Wherein, the first transistor is an N-type transistor. The first transistor comprises a first source/drain terminal, a second source/drain terminal, a gate terminal and a base terminal. The first source/drain terminal of the first transistor is coupled to the first input terminal, the second source/drain terminal serves as the second output terminal of the first transistor, the gate terminal of the first transistor is coupled to the first input terminal and grounded, and the base terminal of the first transistor is grounded. Furthermore, the second transistor is also an N-type transistor. The second transistor comprises a first source/drain terminal, a second source/drain terminal, a gate terminal and a base terminal. The first source/drain terminal of the second transistor serves as the first output terminal, the second source/drain terminal of the second transistor is coupled to the second input terminal, the gate terminal of the second transistor is coupled to the gate terminal of the first transistor, and the base terminal of the second transistor is grounded.

In another aspect of the present invention, when the first and the second transistors are replaced by P-type transistors, the gate terminal of the first P-type transistor is coupled to the gate terminal of the second P-type transistor, and to the first input terminal and the second input terminal, and the base terminals of the first and the second transistors are coupled to the high-voltage external power terminal.

The second electrostatic detecting module comprises: a third transistor and a fourth transistor. Wherein, the third and the fourth transistors are P-type transistors. The third transistor comprises a first source/drain terminal, a second source/drain terminal, a gate terminal and a base terminal. The first source/drain terminal of the third transistor is coupled to the third input terminal, the second source/drain terminal of the third transistor serves as the fourth output terminal, the gate terminal of the third transistor is coupled to the high-voltage external power terminal and the fourth input terminal, and the base terminal of the third transistor is coupled to the high-voltage external power terminal. The fourth transistor comprises a first source/drain terminal, a second source/drain terminal, a gate terminal and a base terminal. The first source/drain terminal of the fourth transistor serves as the third output terminal, the second source/drain terminal of the fourth transistor is coupled to the fourth input terminal, the gate terminal of the fourth transistor is coupled to the gate terminal of the third transistor, the base terminal of the fourth transistor is coupled to the high-voltage external power terminal.

In another aspect of the present invention, when the third and the fourth transistors are replaced by N-type transistors, the gate terminal of the third transistor is coupled to the gate terminal of the fourth transistor, and to the third input terminal and the fourth input terminal, the base terminal of the third transistor is grounded and the base terminal of the fourth transistor is coupled to the fourth input terminal.

Accordingly, the double-triggered silicon controlling rectifier and the related circuit thereof of the present invention reduce the switch voltage and the turn-on time as to effectively serve as a electrostatic discharge devices and circuit.

In order to make the aforementioned and other objects, features and advantages of the present invention understandable, a preferred embodiment accompanied with figures is described in detail below.

DETAILED DESCRIPTION OF EMBODIMENTS

Figure 2A:
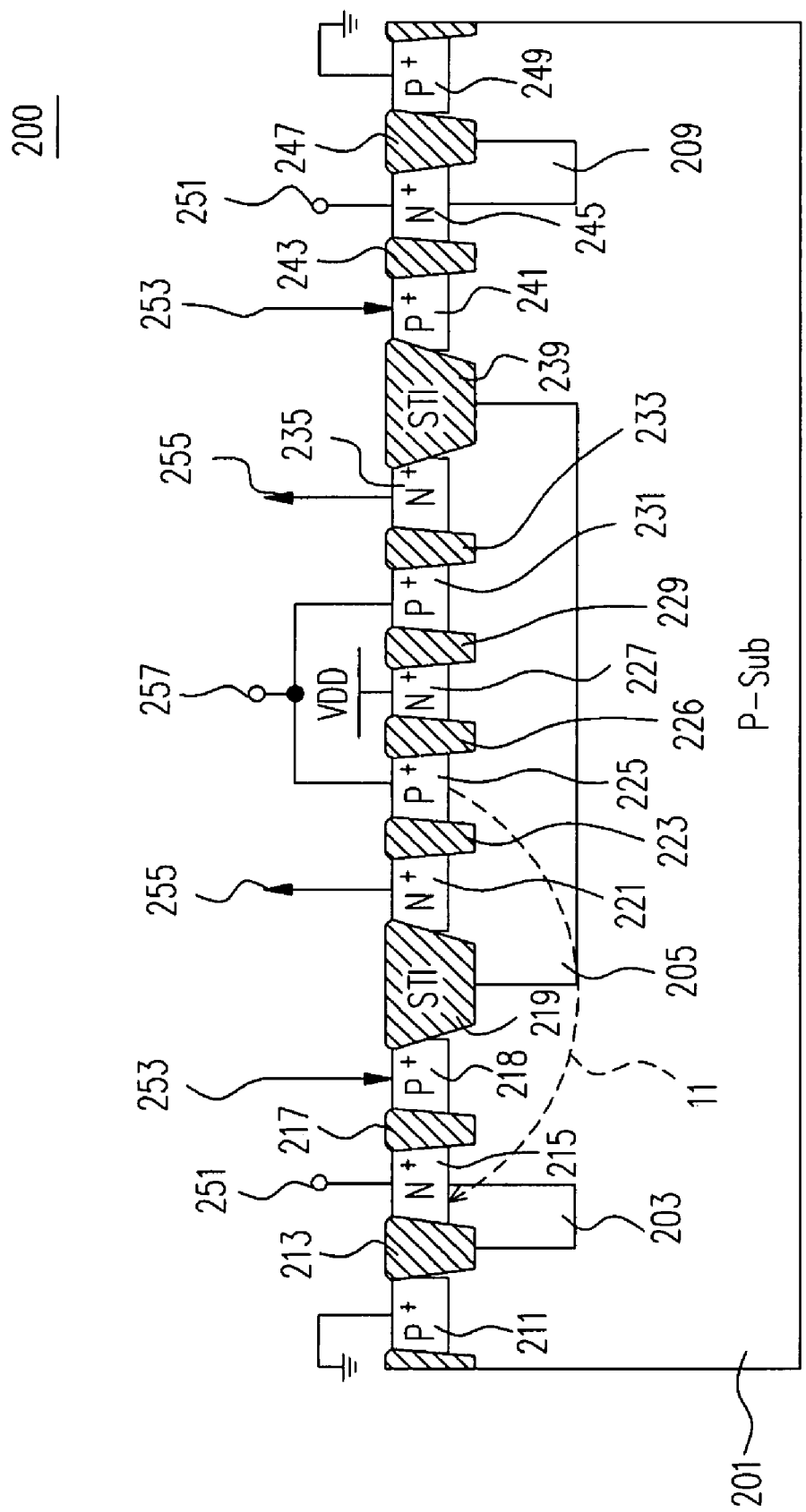
FIG. 2A is a cross-sectional view showing a preferred double-triggered silicon controlling rectifier of the present invention.

FIG. 2A is a cross-sectional view showing a preferred double-triggered silicon controlling rectifier of the present invention. Referring to FIG. 2A, the double-triggered silicon controlling rectifier 200 of the present invention comprises N-well regions 203, 205 and 209 within a P-type substrate 201, comprising a plurality of N+ diffusion areas 227 and a plurality of P+ diffusion areas 231. The diffusion areas are isolated by isolation structures, namely, STI 226. The double-triggered silicon controlling rectifier 200 of the present invention further comprises an anode 257, a cathode 251, a N-type trigger terminal 255 and a P-type trigger terminal 253.

The N+ diffusion areas of the double-triggered silicon controlling rectifier 200 of the present invention comprise: N+ diffusion areas 227, 235, 221, 245 and 215. The N+ diffusion area 227 is coupled to the external power terminal VDD. The N+ diffusion areas 235 and 221 are respectively on each side of the N+ diffusion area 227, opposite to each other. The N+ diffusion areas 221 and 235 are formed in the N-well region 205, serving as the N-type trigger terminal 255 of the double-triggered silicon controlling rectifier 200.

In addition, the N+ diffusion areas 245 and 227 are respectively on each side of the N+ diffusion area 235, opposite to each other, and in the N-well region 209. The N+ diffusion areas 215 and 227 are respectively on each side of the N+ diffusion area 221, opposite to each other, and in the N-well region 203. In the double-triggered silicon controlling rectifier 200 of the present invention, the N+ diffusion areas 215 and 245 serve as the cathode 251 thereof.

Referring to FIG. 2A, the P+ diffusion areas of the double-triggered silicon controlling rectifier 200 of the present invention comprise: P+ diffusion areas 231, 225, 241, 218, 249 and 211. The P+ diffusion area 231 is formed between the N+ diffusion areas 227 and 235. The P+ diffusion area 225 is formed between the N+ diffusion areas 227 and 221, and in the N-well region 205. Wherein, the P+ areas 231 and 225 is formed within the N-well region 205. The P+ areas 231 and 225 serve as the anode 257 of the double-triggered silicon controlling rectifier 200. The N+ and P+ diffusion areas within the N-well region 205 are isolated by the isolation structures 219, 223, 226, 229, 233 and 239.

Additionally, the P+ diffusion area 241 is formed between the N+ diffusion areas 235 and 245, and in the P-type substrate 201 between the N-well regions 205 and 209. The P+ diffusion area 241 is isolated by the shallow trench isolation (STI) structures 239 and 243. The P+ diffusion area 218 is formed between the N+ diffusion areas 221 and 215, and in the P-type substrate 201 between the N-well regions 205 and 203. The P+ diffusion area 218 is isolated by the shallow trench isolation (STI) structures 217 and 219. In the present invention, the P+ diffusion areas 241 and 218 serve as the P-type trigger terminal 253 of the double-triggered silicon controlling rectifier 200.

Moreover, the P+ diffusion areas 249 and 241 are respectively formed on each side of the N+ diffusion area 245, opposite to each other, and in the P-type substrate 201. The P+ diffusion areas 211 and 218 are respectively formed on each side of the N+ diffusion area 215, opposite to each other, and in the P-type substrate 201. In the present invention, the P+ diffusion areas 249 and 211 serve as the ground terminal, and are closest to the edge of the double-triggered silicon controlling rectifier 200. The STI structures 247 and 213 isolate the P+ diffusion areas 249 and 211 and the N+ diffusion areas 215 and 245.

Figure 2B:
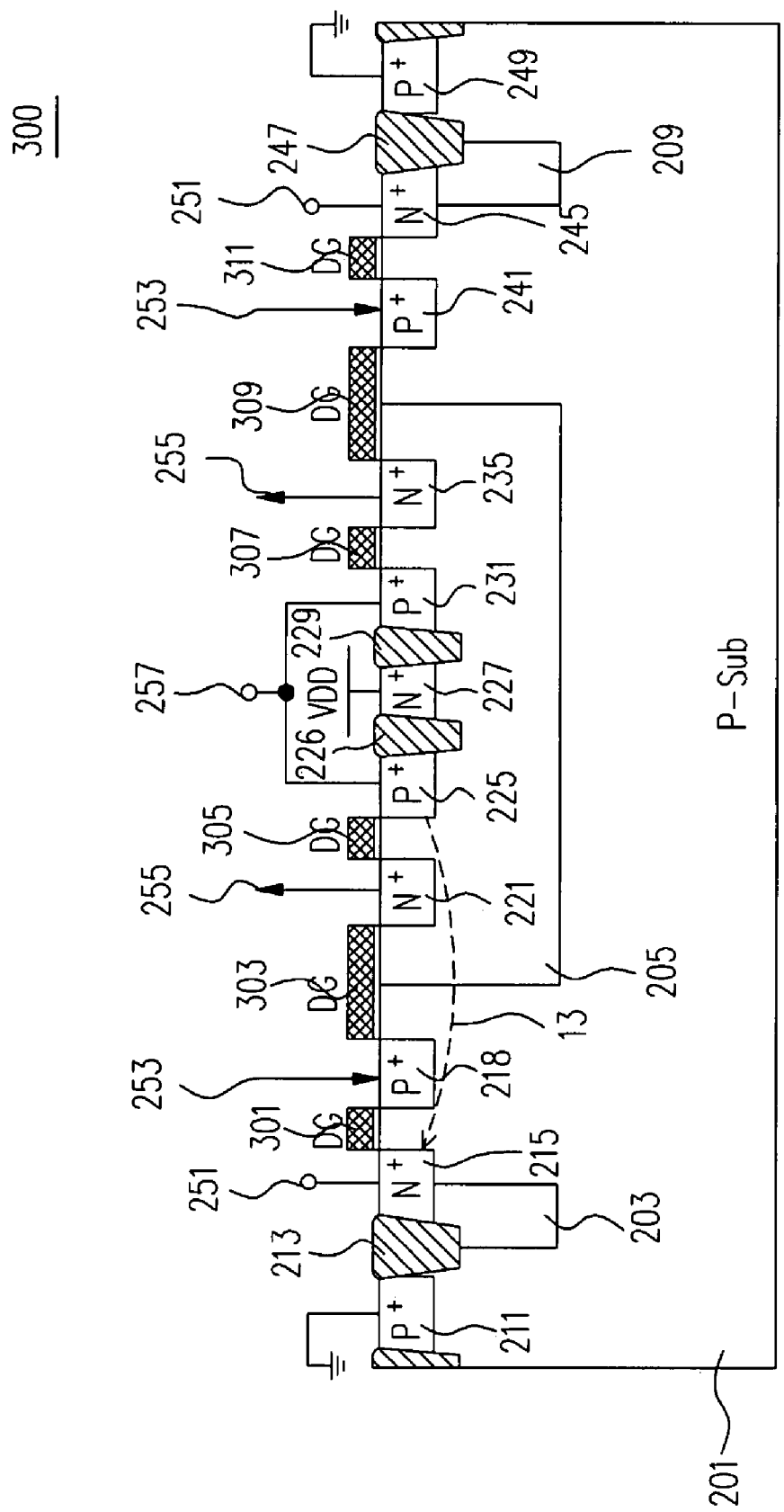
FIG. 2B is a cross-sectional view showing another preferred double-triggered silicon controlling rectifier of the present invention.

FIG. 2B is a cross-sectional view showing another preferred double-triggered silicon controlling rectifier of the present invention. Referring to FIGS. 2A and 2B, the STI structures 217, 219, 223, 233, 239 and 243 in FIG. 2A are replaced by dummy gates 301, 303, 305, 307, 309 and 311. Referring to FIG. 2A, the STI structures 217, 219 and 223 are formed between the anode 257 and the cathode 251. When flowing from the anode 257 to the cathode 251, ESD charges should go around and through the path 11. In FIG. 2B, the STI structures 217, 219 and 223 are replaced by the dummy gates 301, 303 and 305. ESD charges flow from the anode 257 to the cathode 251 through the path 13. Theoretically, the double-triggered silicon controlling rectifier 300 has a high turn-on speed.

As to the fabricating process of the present invention, it can be fabricated by 0.25-μm CMOS technology. In typical 0.25-μm CMOS technology, the depth of the STI structure is about 0.4 μm and the depths of the P+ and N+ diffusion areas are about 0.18 μm.

Figure 1A:
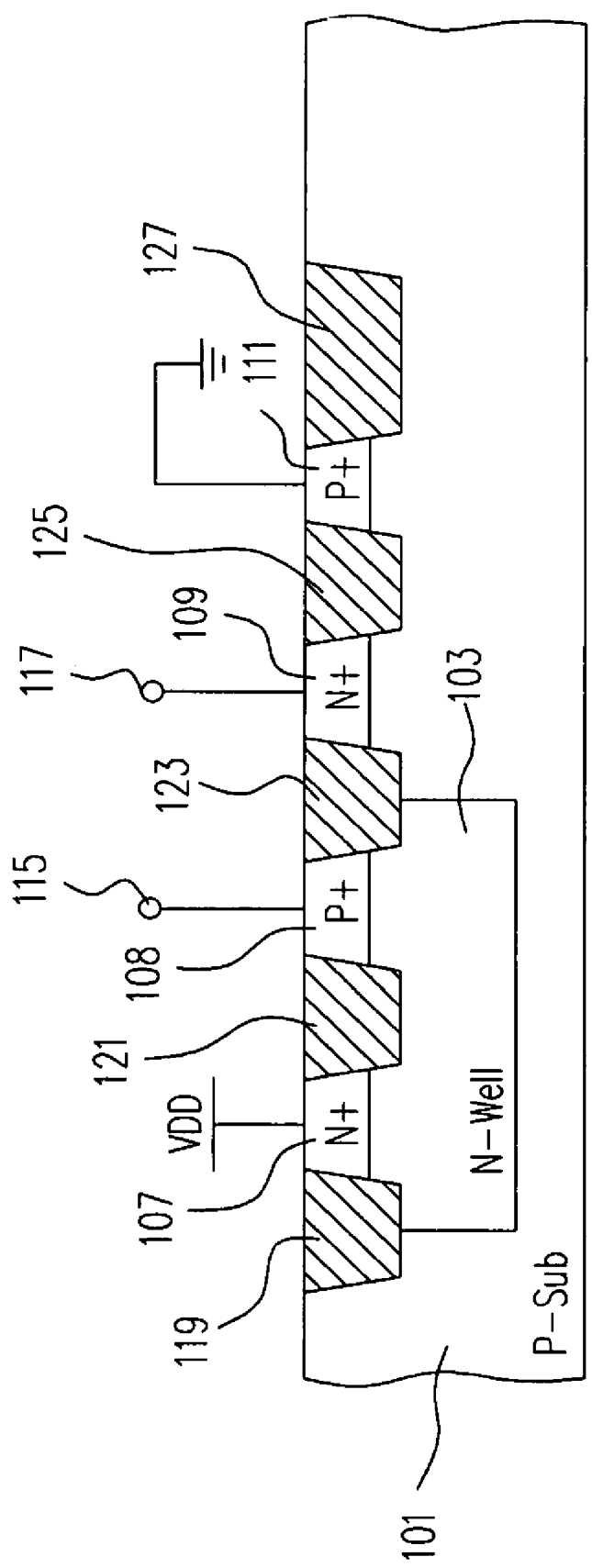
FIG. 1A is a configuration showing a conventional silicon controlling rectifier.
Figure 1B:
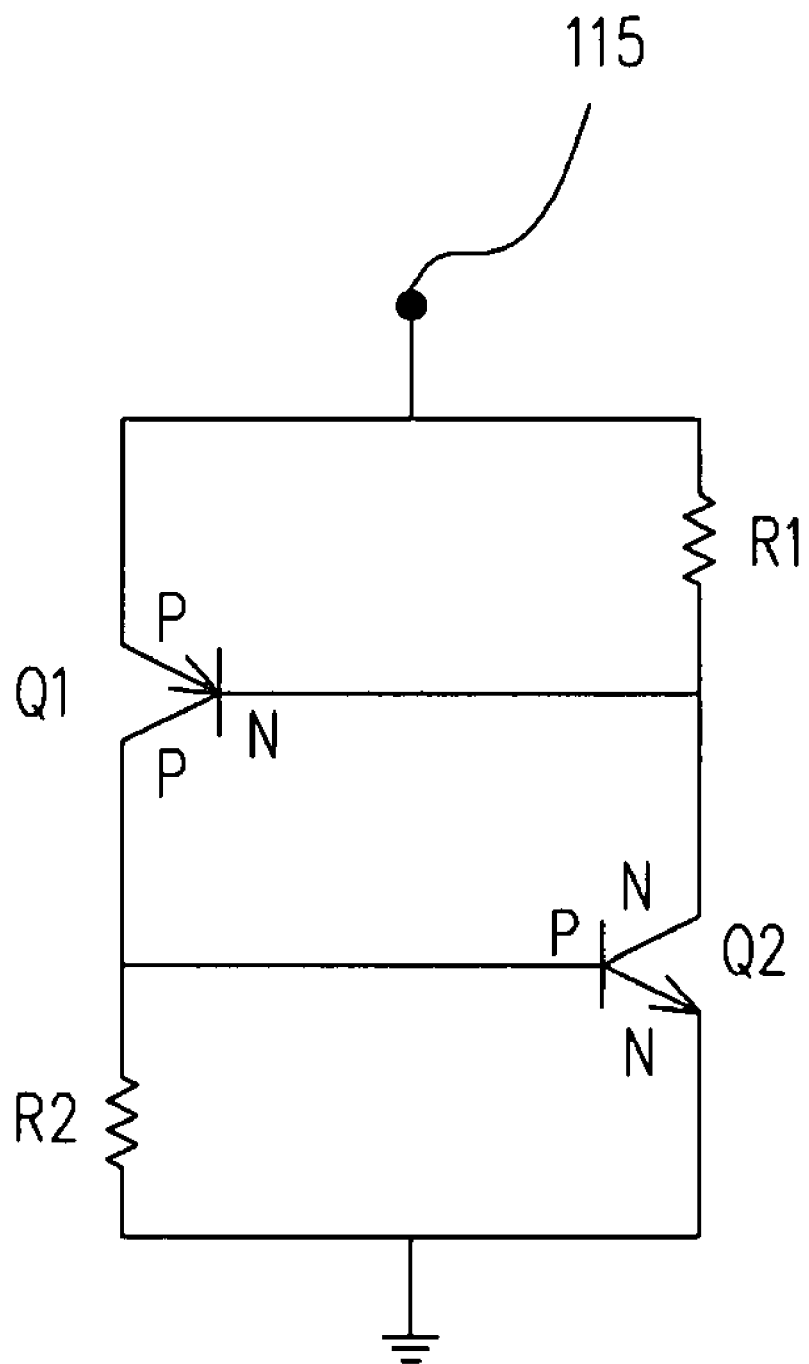
FIG. 1B is an equivalent circuit of the conventional silicon controlling rectifier shown in FIG. 1A.
Figure 2C:
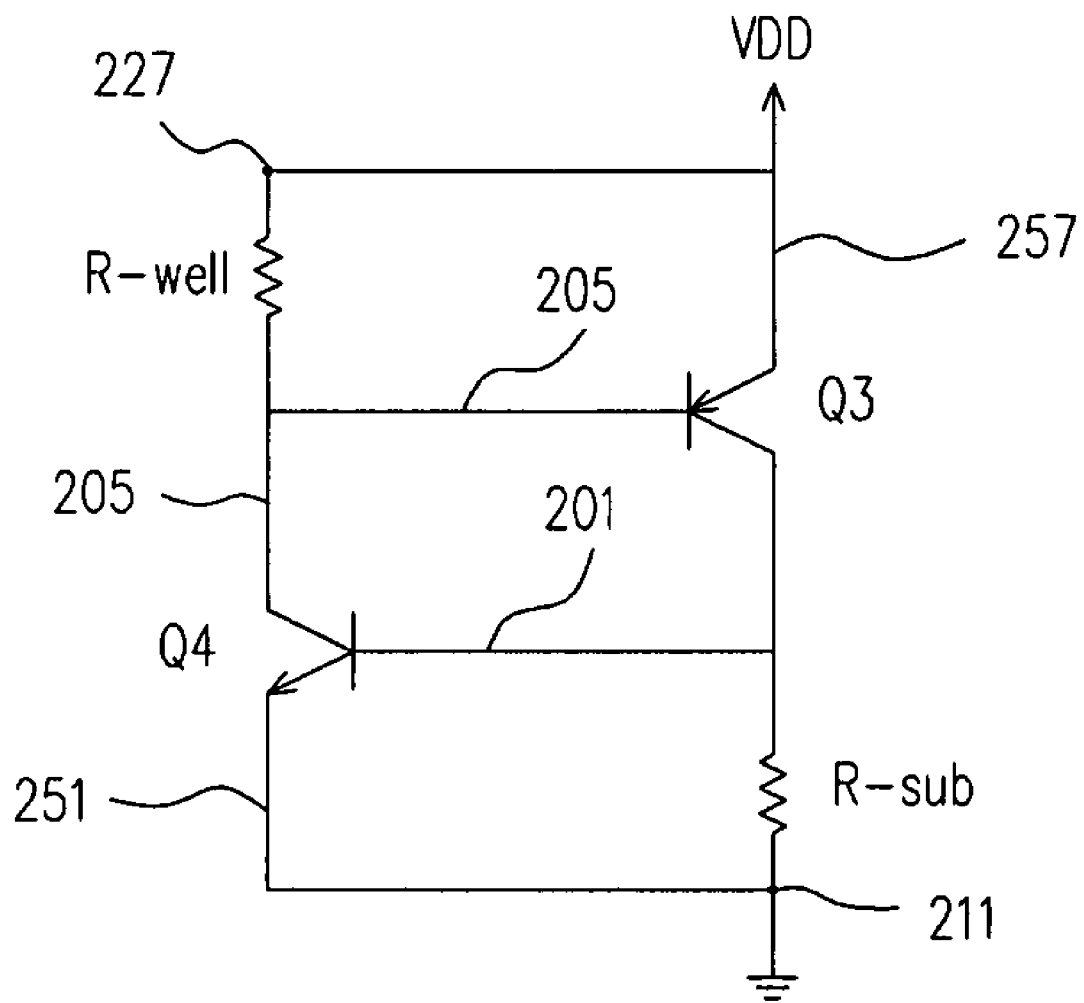
FIG. 2C is an equivalent circuit of preferred double-triggered silicon controlling rectifier of the present invention.

Referring to FIG. 2C, the equivalent circuit of the double-triggered silicon controlling rectifier of the present invention is similar to that of the conventional silicon controlling rectifier in FIG. 1B. The transistor Q3 is a parasitic PNP transistor among the P+ anode 257, N-well 205 and the p-type substrate 201. The transistor Q4 is a parasitic NPN transistor among the N-well 205, the p-type substrate 201 and the N+ cathode 251. The R_well is the interface resistance between the N+ diffusion area 227 and the N-well region 205 in FIG. 2A. The R_sub is the interface resistance between the ground terminal 211 and the P-type substrate 201 in FIG. 2A.

Figure 3A:
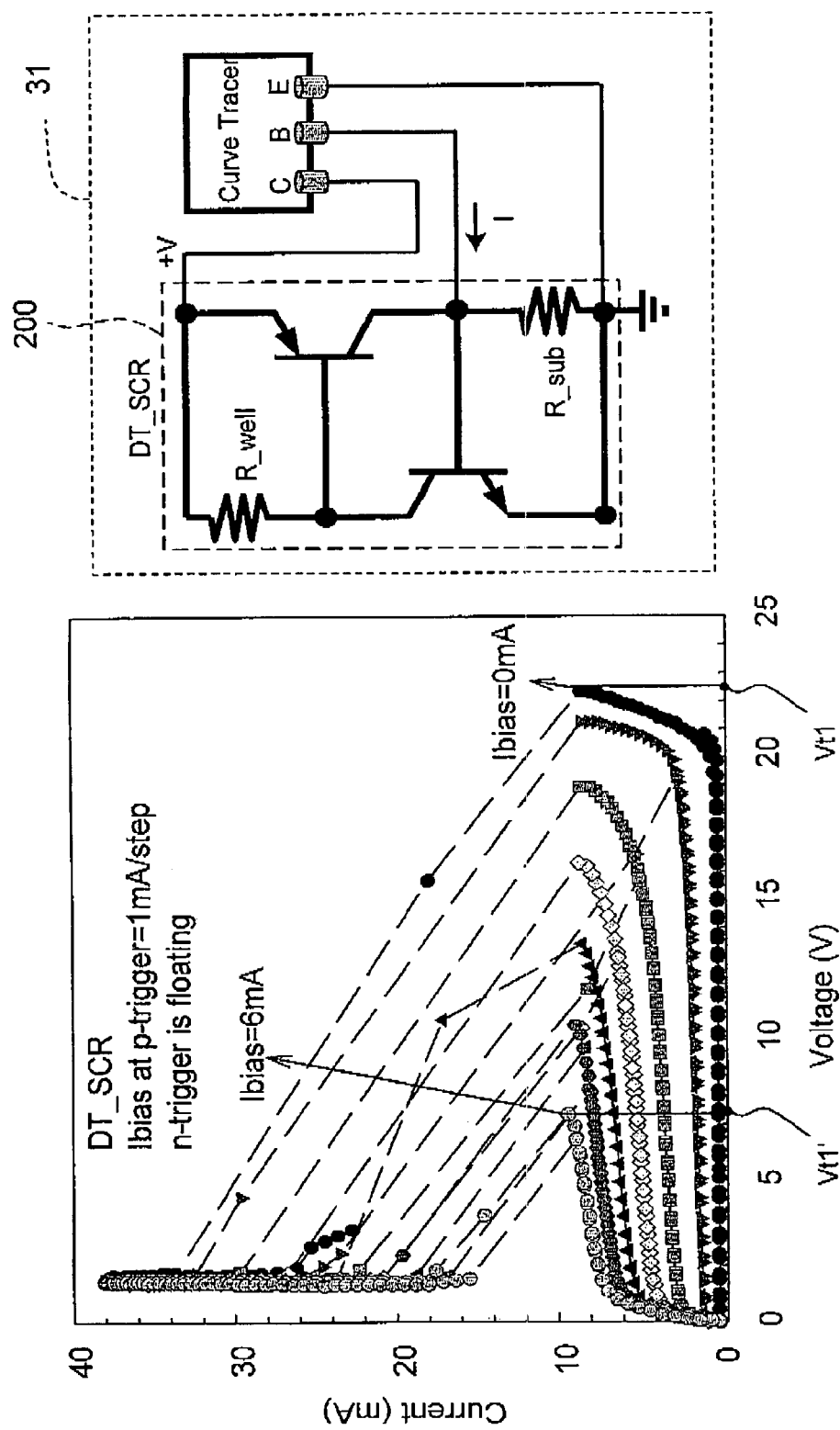
FIG. 3A is the I-V curves of the double-triggered silicon controlling rectifier when the N-type trigger terminal is floating.

FIG. 3A is the I-V curves of the double-triggered silicon controlling rectifier when the N-type trigger terminal is floating. Following are tests of the double-triggered silicon controlling rectifier of the present invention. Referring to FIG. 3A, the N-type trigger terminal 255 of the double-triggered silicon controlling rectifier 200 is floating, and a trigger current, 1 mA/step from 0 mA to 6 mA, is applied to the P-type trigger terminal 253. By the applying the trigger current, the change of the switching voltage can be observed. The circuit 31 is the testing circuit in FIG. 3A. Referring to FIG. 3A, when the trigger current is 0 mA, the switching voltage Vt1 of the double-triggered silicon controlling rectifier 200 is about 22 V. When the trigger current is 6 mA, the switching voltage Vt1' of the double-triggered silicon controlling rectifier 200 is about 7 V. Accordingly, when the trigger current is increased from 0 mA to 6 mA, the switching voltage is reduced by 15 V.

Figure 3B:
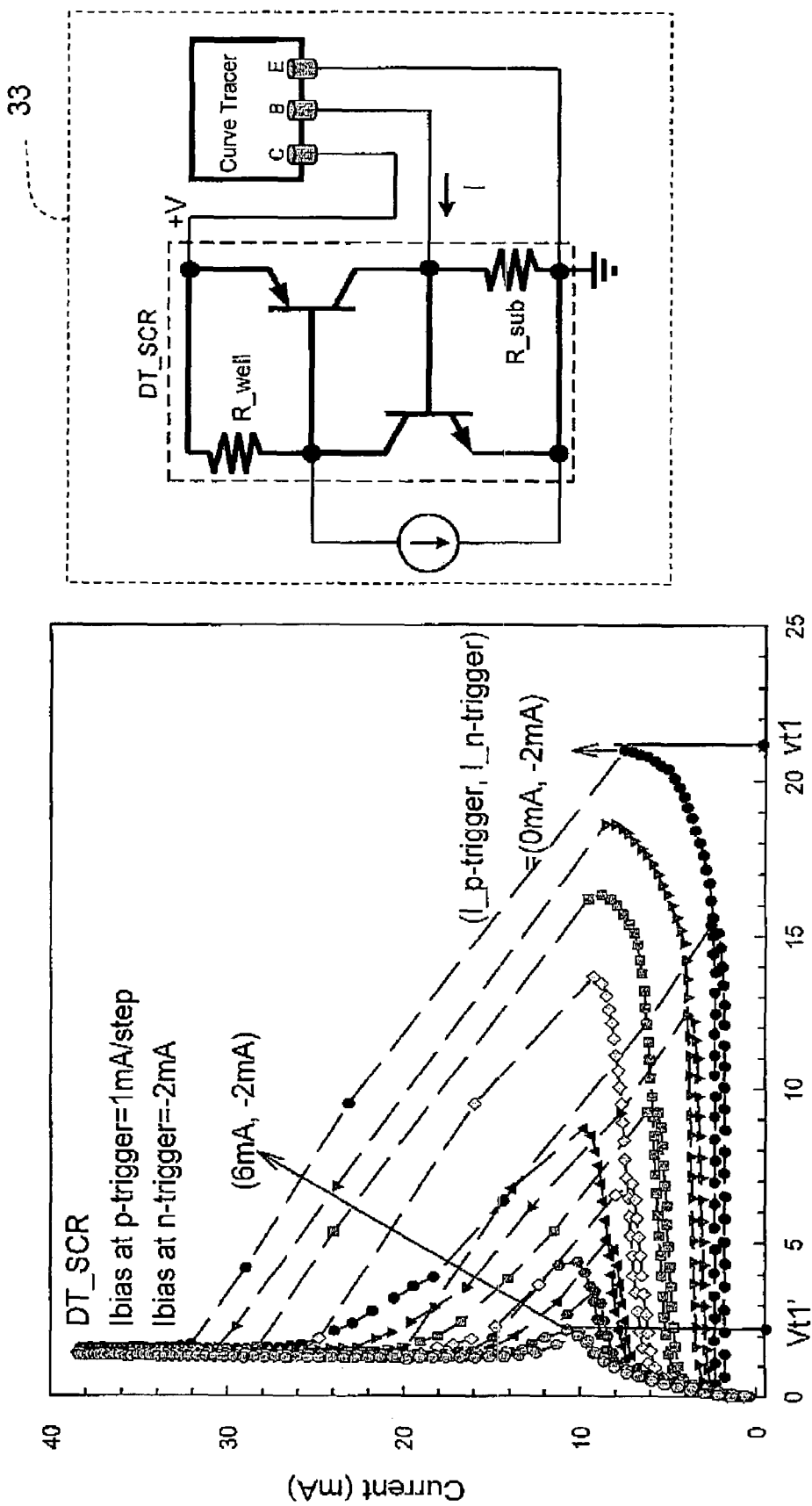
FIG. 3B is the I-V curves of the double-triggered silicon controlling rectifier when the trigger current is applied to the N-type and the P-type trigger terminals.

FIG. 3B is I-V curves of the double-triggered silicon controlling rectifier when the trigger currents are applied to the N-type and the P-type trigger terminals. The tests in FIG. 3B is the continuation of those in FIG. 3A, but the N-type trigger terminal is coupled to a −2 mA current source. The trigger current, 1 mA/step from 0 mA to 6 mA, is applied to the P-type trigger terminal. By the applying the trigger current, the change of the switching voltage can be observed. The circuit 33 is the testing circuit in FIG. 3B. Referring to FIG. 3B, when the trigger current coupled to the P-type trigger terminal is 0 mA and the trigger current coupled to the N-type trigger terminal is −2 mA, the switching voltage Vt1 of the double-triggered silicon controlling rectifier 200 is about 21 V. When the trigger current coupled to the P-type trigger terminal is 6 mA, the switching voltage Vt1' of the double-triggered silicon controlling rectifier 200 is about 3 V. Accordingly, when the N-type trigger current is −2 mA, and the P-type trigger current is increased from 0 mA to 6 mA, the switching voltage is reduced by 18 V.

Figure 3C:
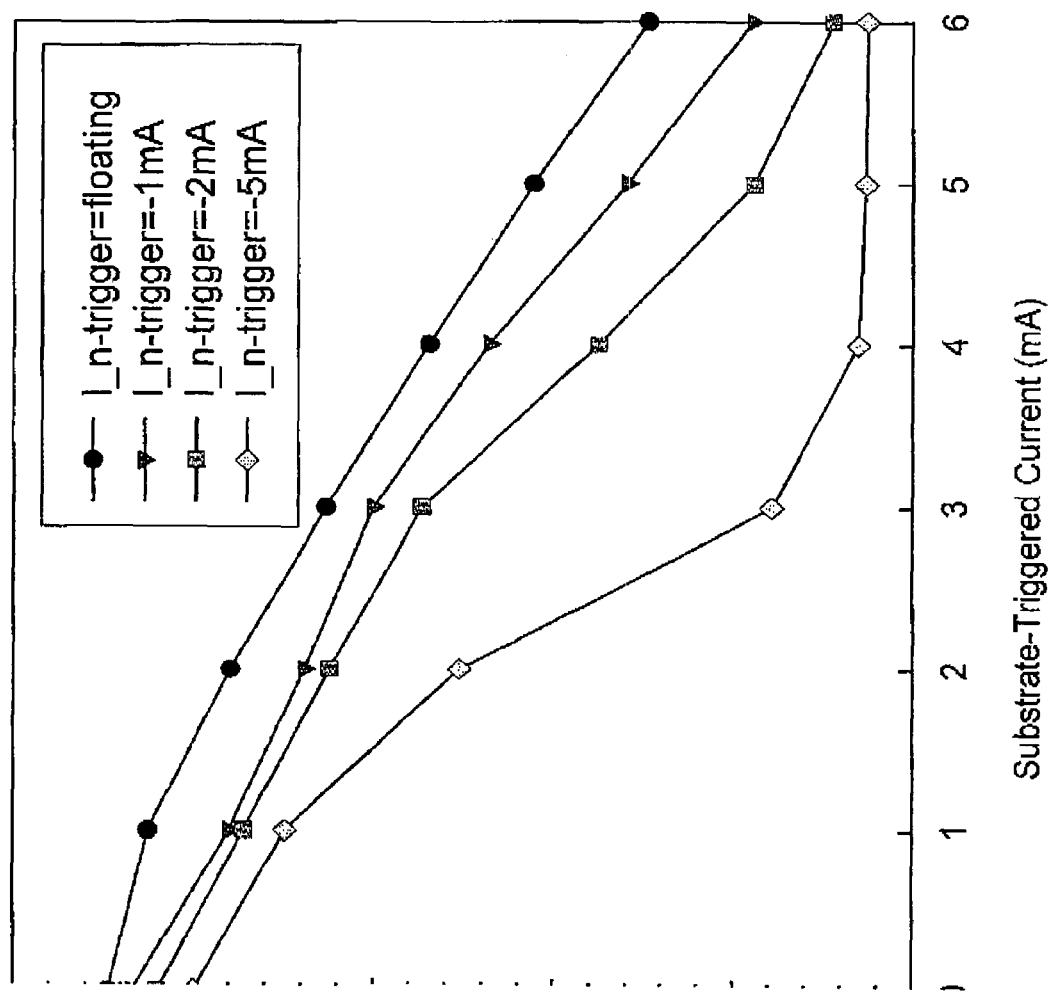
FIG. 3C is the I-V curves showing the relationship between the switching voltage and the base current of the double-triggered silicon controlling rectifier with STI.
Figure 3D:
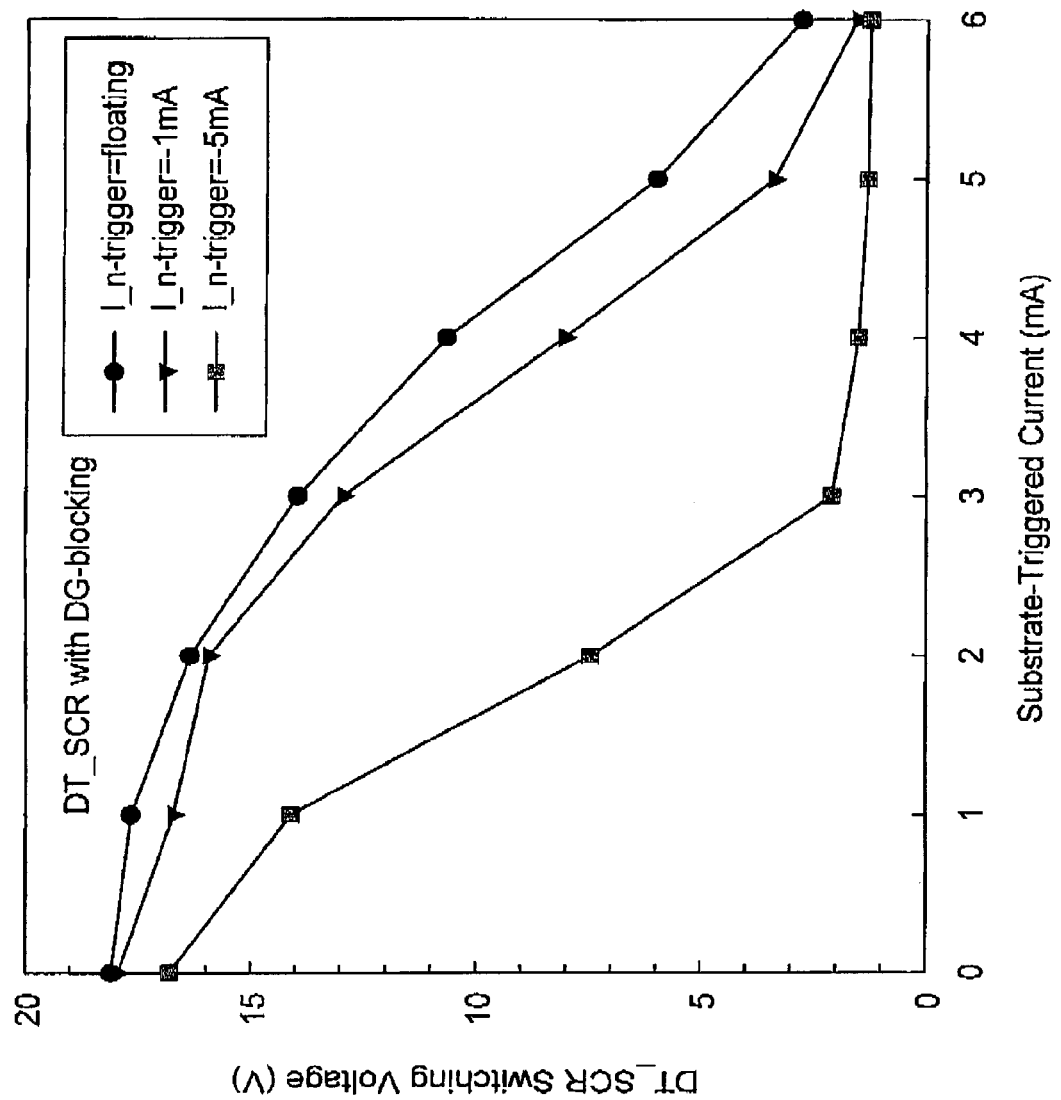
FIG. 3D is the I-V curves showing the relationship between the switching voltage and the base current of the double-triggered silicon controlling rectifier with dummy gate structures.

FIG. 3C is the I-V curves showing the relationship between the switching voltage and the base current of the double-triggered silicon controlling rectifier with STI. FIG. 3D is I-V curves showing the relationship between the switching voltage and the base current of the double-triggered silicon controlling rectifier with dummy gate structures. In FIG. 3C, the N-type trigger terminal of the double-triggered silicon controlling rectifier with STI is coupled with a current from floating state to −5 mA, and the base current of the P-type trigger terminal is from 0 mA to 6 mA. In this test, the switching voltage is dropped to 2 V when the N-type trigger terminal is coupled to −5 mA and the P-type trigger terminal is 4 mA. In FIG. 3D, the STI structure of the double-triggered silicon controlling rectifier is replaced by the dummy gate structures, and the same test is repeated. In this test, the switching voltage is dropped to 2 V when the N-type trigger terminal is coupled to −5 mA and the P-type trigger terminal is 3 mA.

Accordingly, in the double-triggered silicon controlling rectifier of the present invention, simultaneously applying trigger currents to the N-type and the P-type trigger terminals performs better than only applying a trigger current to the P-type trigger terminal. Under the similar situation, the dropping rate of the switching voltage of the double-triggered silicon controlling rectifier with dummy gate structures is sooner than that of the double-triggered silicon controlling rectifier with STI.

Figure 3E:
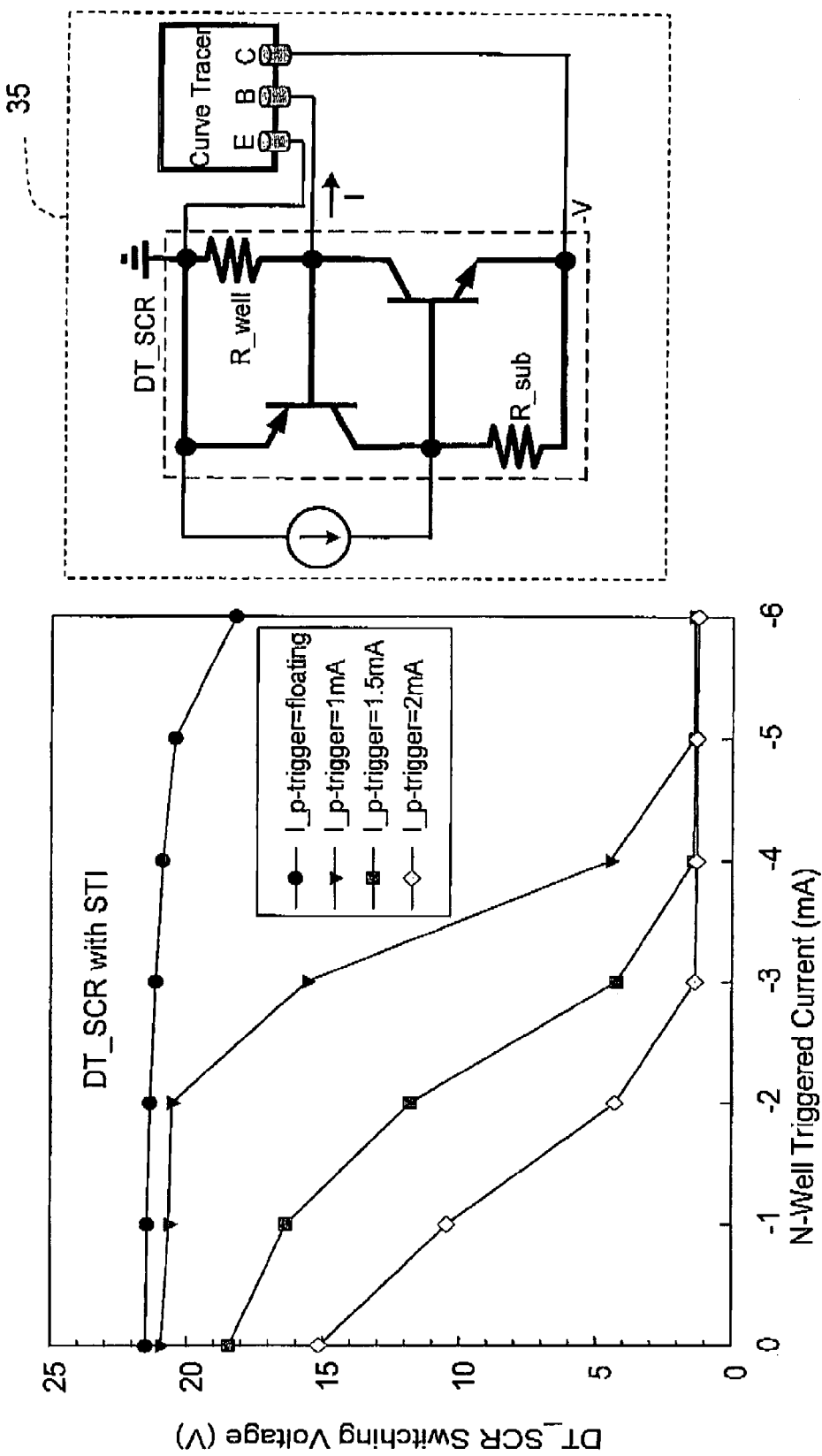
FIG. 3E is the I-V curves showing the relationship between the switching voltage and the N-well current of the double-triggered silicon controlling rectifier with STI.

FIG. 3E is the I-V curves showing the relationship between the switching voltage and the N-well current of the double-triggered silicon controlling rectifier with STI. Referring to FIG. 3E, the circuit of this test is the circuit 35. The P-type trigger terminal of the double-triggered silicon controlling rectifier with STI is coupled to a current from floating state to 2 mA and the N-well current is coupled to the N-type trigger terminal. When the P-type trigger terminal is floating, the dropping rate of the switching voltage is poor. Comparing FIGS. 3E and 3C, applying the substrate current to the P-type trigger terminal can get better performance than applying the N-well current to the N-type trigger terminal. The sooner the dropping rate of the switching voltage, the faster the double-triggered silicon controlling rectifier turns on for protecting the internal circuit against ESD.

Figure 4A:
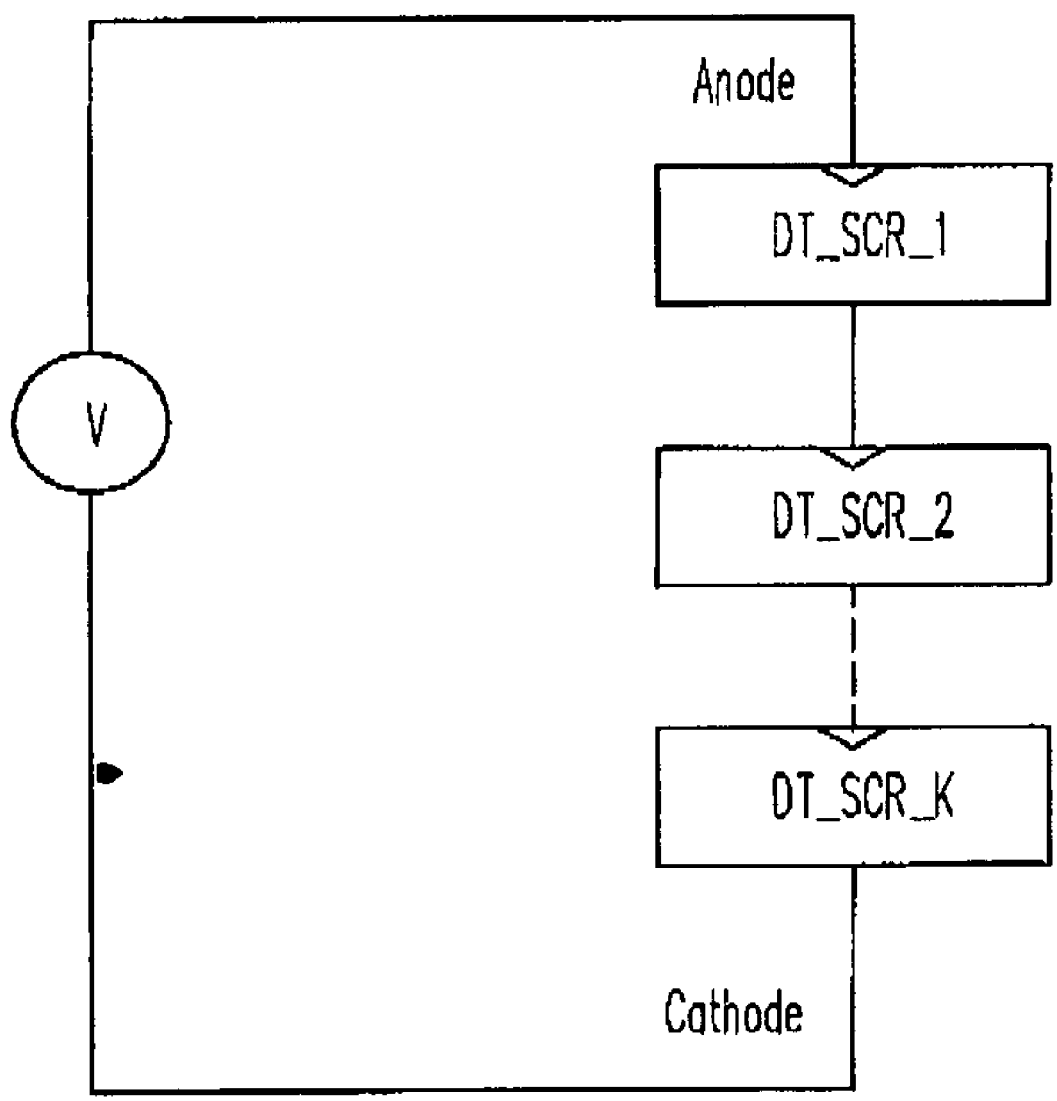
FIG. 4A is the schematic structure of the stacked double-triggered silicon controlling rectifier.
Figure 4B:
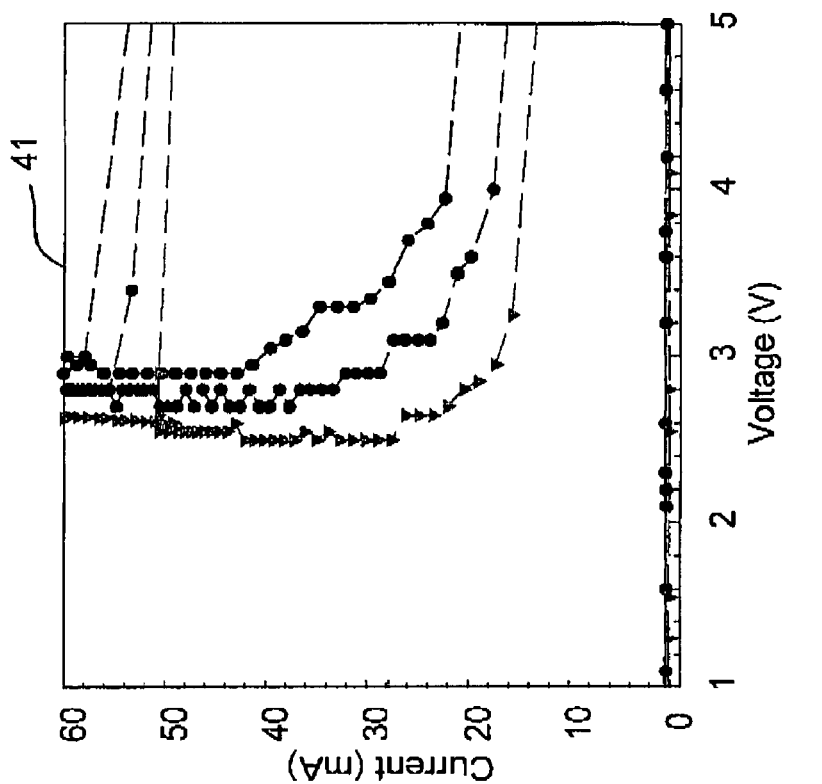
FIG. 4B is the I-V curves of a two-stacked double-triggered silicon controlling rectifier under different temperatures.
Figure 4B:
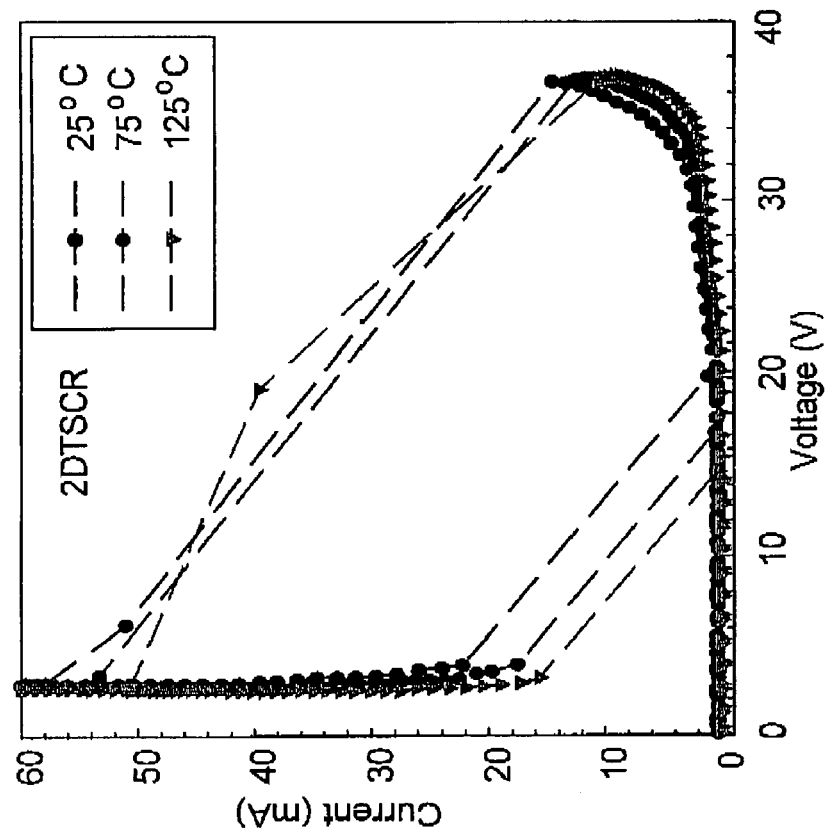
Figure 4C:
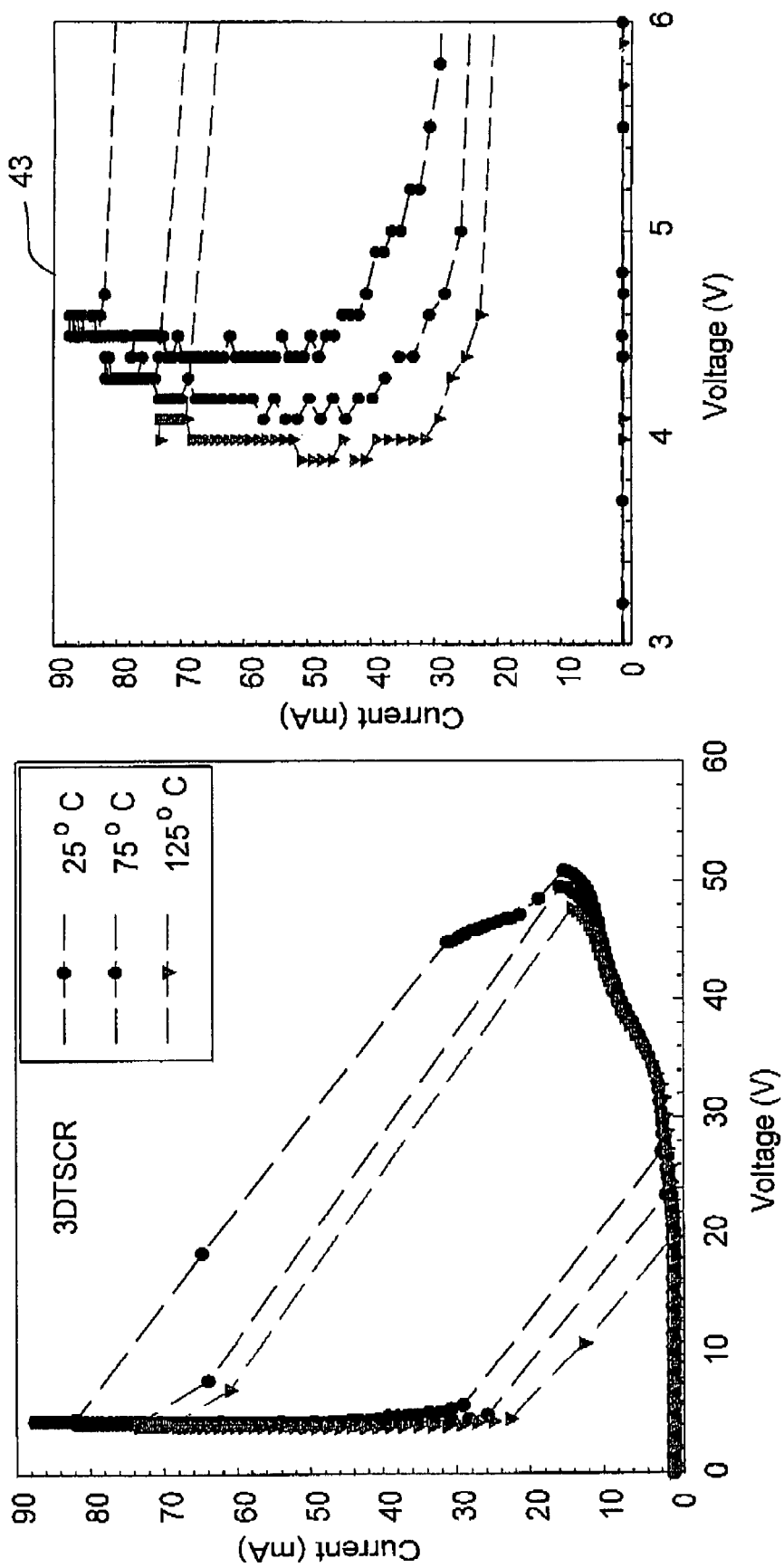
FIG. 4C is the I-V curves of a three-stacked double-triggered silicon controlling rectifier under different temperatures.
Figure 4D:
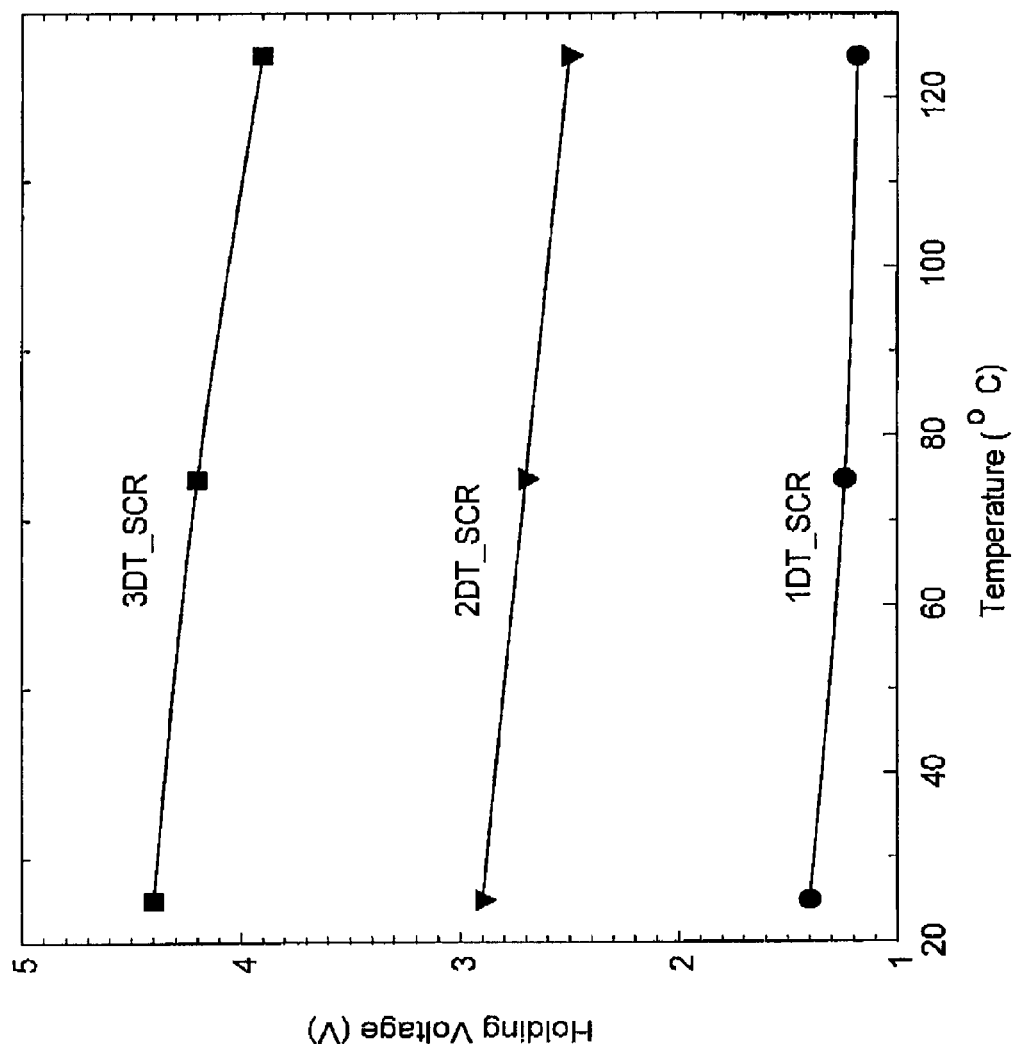
FIG. 4D is the relationship between the holding voltage of double-triggered SCR and temperature under different stacked numbers.

FIG. 4A is the schematic structure of the stacked double-triggered silicon controlling rectifier. FIG. 4B is the I-V curves of a two-stacked double-triggered silicon controlling rectifier under different temperatures. FIG. 4C is the I-V curves of a three-stacked double-triggered silicon controlling rectifier under different temperatures. FIG. 4D is the relationship between the holding voltage of double-triggered SCR and temperature under different stacked numbers. When the CMOS integrated circuit is under normal operation, the holding voltage of the ESD protection device should be larger than the maximum of the external voltage VDD for avoiding the issue of latch-up. In the double-triggered silicon controlling rectifier of the present invention, seacking double-triggered silicon controlling rectifier can achieve the purpose of increasing the holding voltage. Comparing with FIGS. 4B and 4C, the higher the stacked number of the double-triggered silicon controlling rectifier is, the higher the holding voltage is. According to FIGS. 4C and 4D, when temperature increased, the holding voltage is reduced. As shown in FIG. 4D, when the rectifier is a three-stacked double-triggered silicon controlling rectifier and the temperature is 25° C., the holding voltage is about 4.4 V.

Figure 5A:
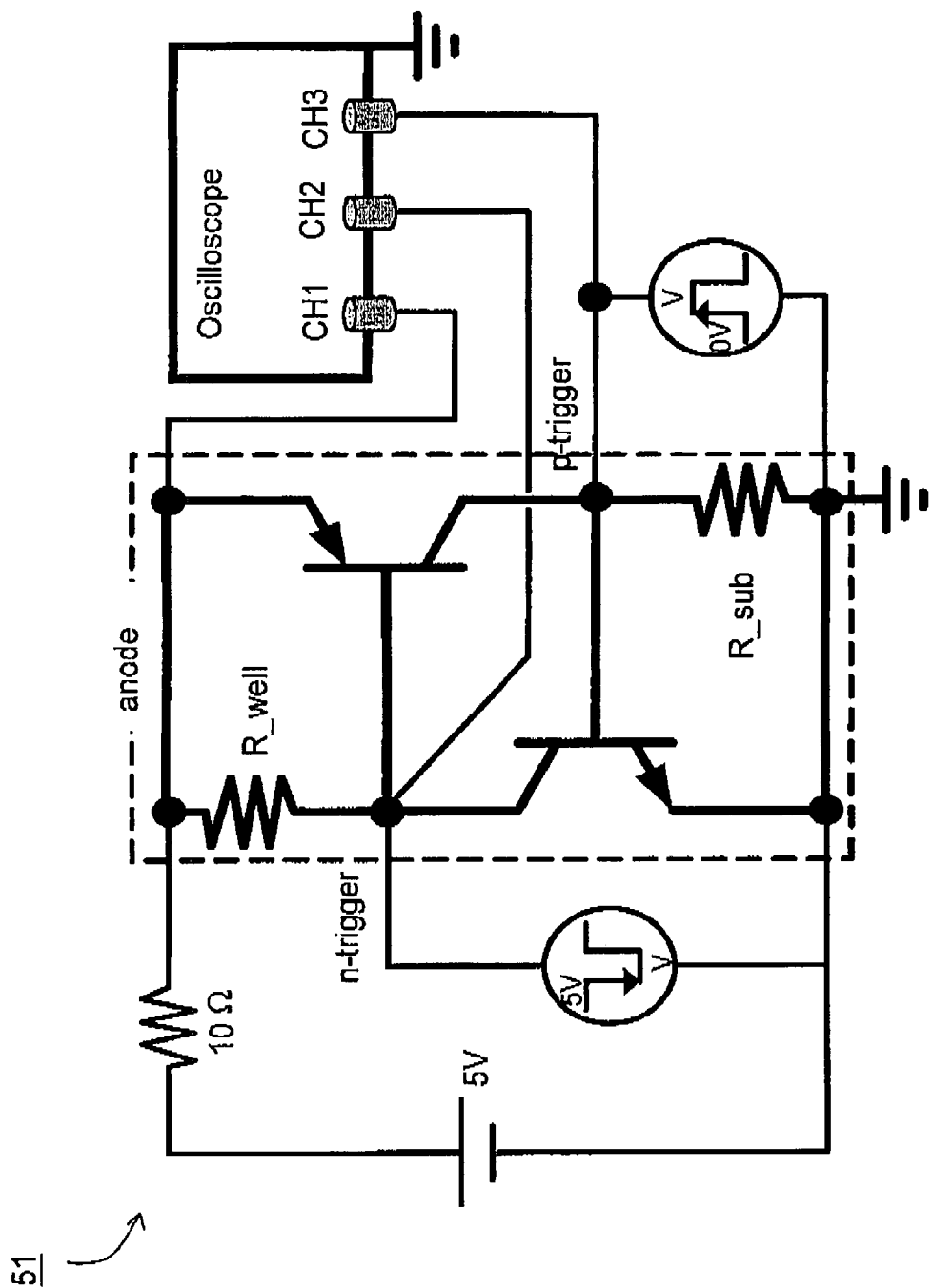
FIG. 5A is a schematic figure showing a preferred circuit for measuring the turn-on time of the double-triggered silicon controlling rectifier of the present invention.
Figure 5B:
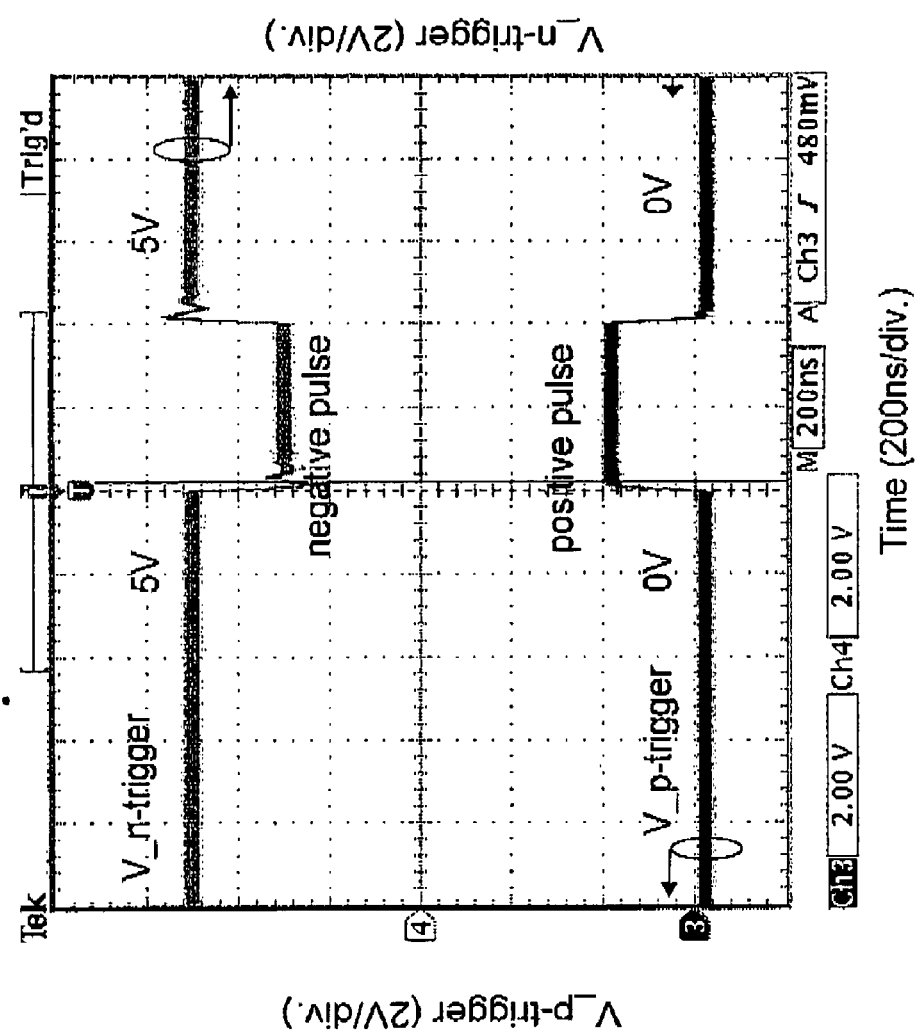
FIG. 5B is a voltage-pulse configuration coupled to the N-type and the P-type trigger terminals.

FIG. 5A is a schematic figure showing a preferred circuit for measuring the turn-on time of the double-triggered silicon controlling rectifier of the present invention. FIG. 5B is a voltage-pulse configuration coupled to the N-type and the P-type trigger terminals. The turn-on time of the silicon controlling rectifier means the time for entering a latching state. Following is the measurement of the turn-on time of the double-triggered silicon controlling rectifier with STI. FIG. 5A is a schematic figure showing a preferred circuit for measuring the turn-on time of the double-triggered silicon controlling rectifier of the present invention. The voltage-pulse shown in FIG. 5B is coupled to the N-type and the P-type trigger terminals of the double-triggered silicon controlling rectifier, and the anode is coupled with 5 V. The resistor 51 serves limiting the current from the power terminal when the double-triggered silicon controlling rectifier is triggered on.

Figure 5C:
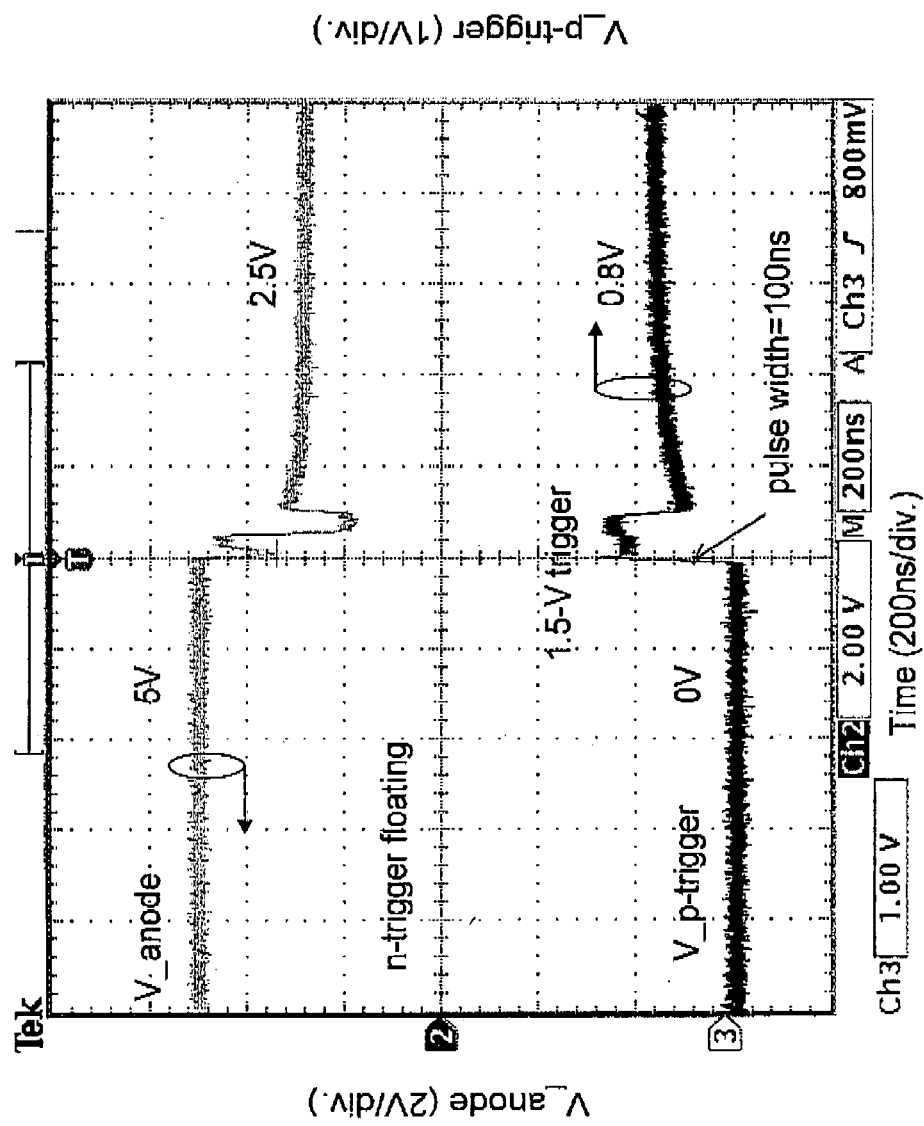
FIGS. 5C and 5D are the measured voltage waveforms on the anode and p-trigger nodes of the DT_SCR device under 1.5-V positive voltage pulse with pulse width of 100 ns, 30 ns, while N-type trigger terminal is floating.
Figure 5D:
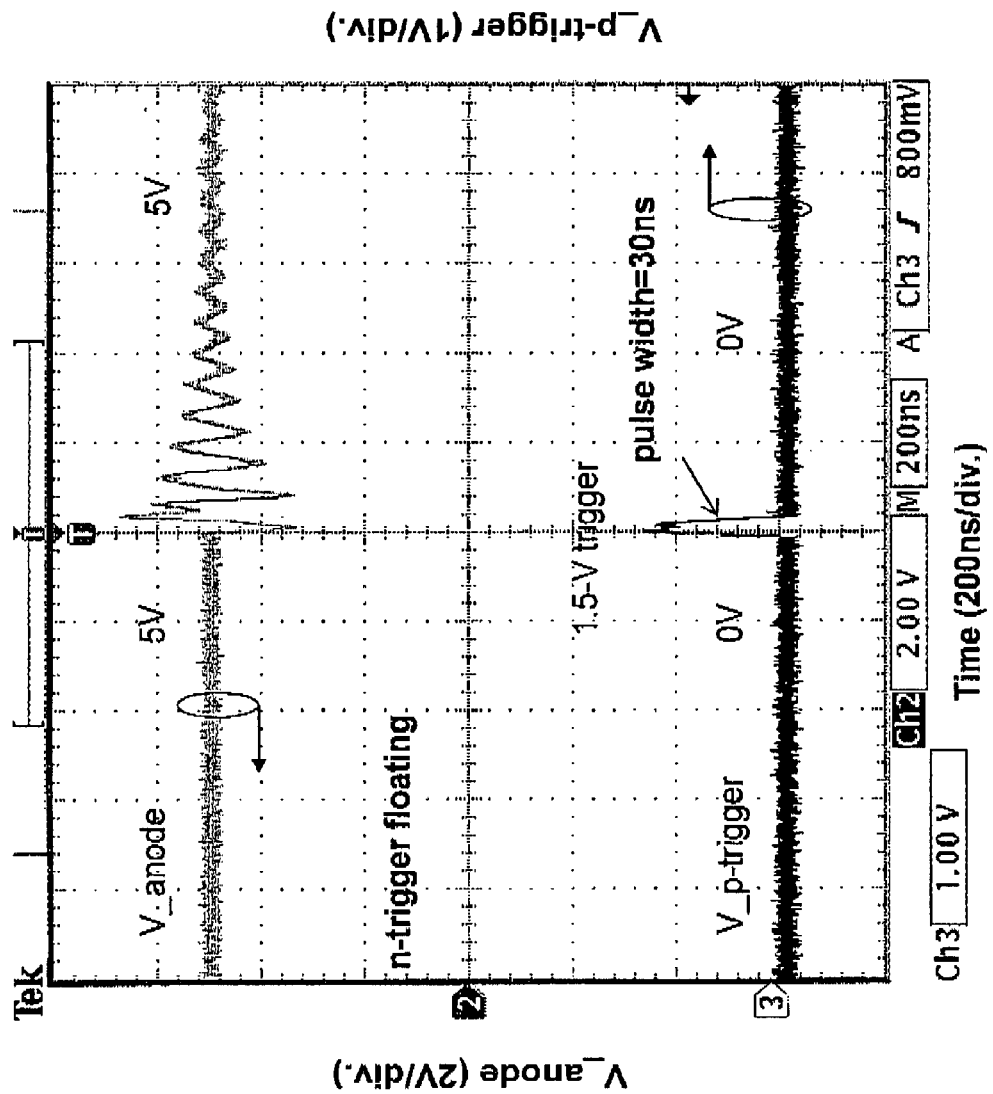

FIGS. 5C and 5D are the measured voltage waveforms at the anode and p-trigger nodes of the DT_SCR device under 1.5-V positive voltage pulse with pulse width of 100 ns, 30 ns, while N-type trigger terminal is floating. To avoid the loading effect from the oscilloscope, following tests are measured at the P-type trigger terminal. In FIG. 5C, after a 1.5-V pulse signal with 100-ns pulse width is coupled to the P-type trigger terminal, the output voltage of the anode drops from 5 V to 2.5 V and is locked. It means that the double-triggered silicon controlling rectifier is in latching state. However, after a 1.5-V pulse signal with 30-ns pulse width is coupled to the P-type trigger terminal, the output voltage of the anode oscillates and is keep at 5 V. It means that the double-triggered silicon controlling rectifier cannot be triggered into latching state.

Figure 5E:
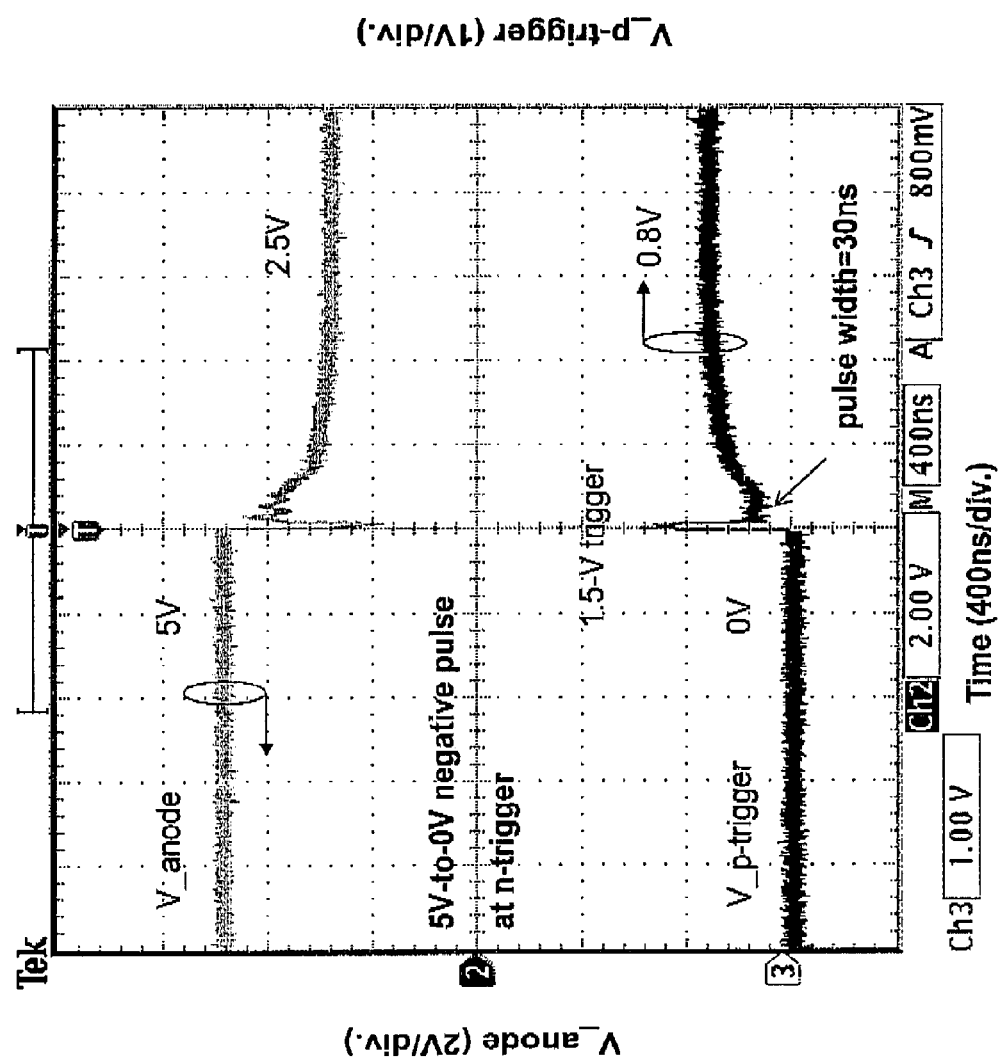
FIG. 5E is the measured voltage waveforms on the anode and p-trigger nodes of the DT_SCR device under 1.5-V positive voltage pulse with pulse width of 30 ns while 5V-to-0V negative voltage pulse is applied to N-type trigger terminal.

FIG. 5E is the measured voltage waveforms at the anode and p-trigger nodes of the DT_SCR device under 1.5-V positive voltage pulse with pulse width of 30 ns while 5V-to-0V negative voltage pulse with the same pulse width of 30 ns is applied to N-type trigger terminal. Following the measurement in FIG. 5D, when a negative-pulse signal from 5 V to 0 V is coupled to the N-type trigger terminal, the output voltage at the anode is kept at 2.5 V. It means that the double-triggered silicon controlling rectifier can be into latching state.

Figure 5F:
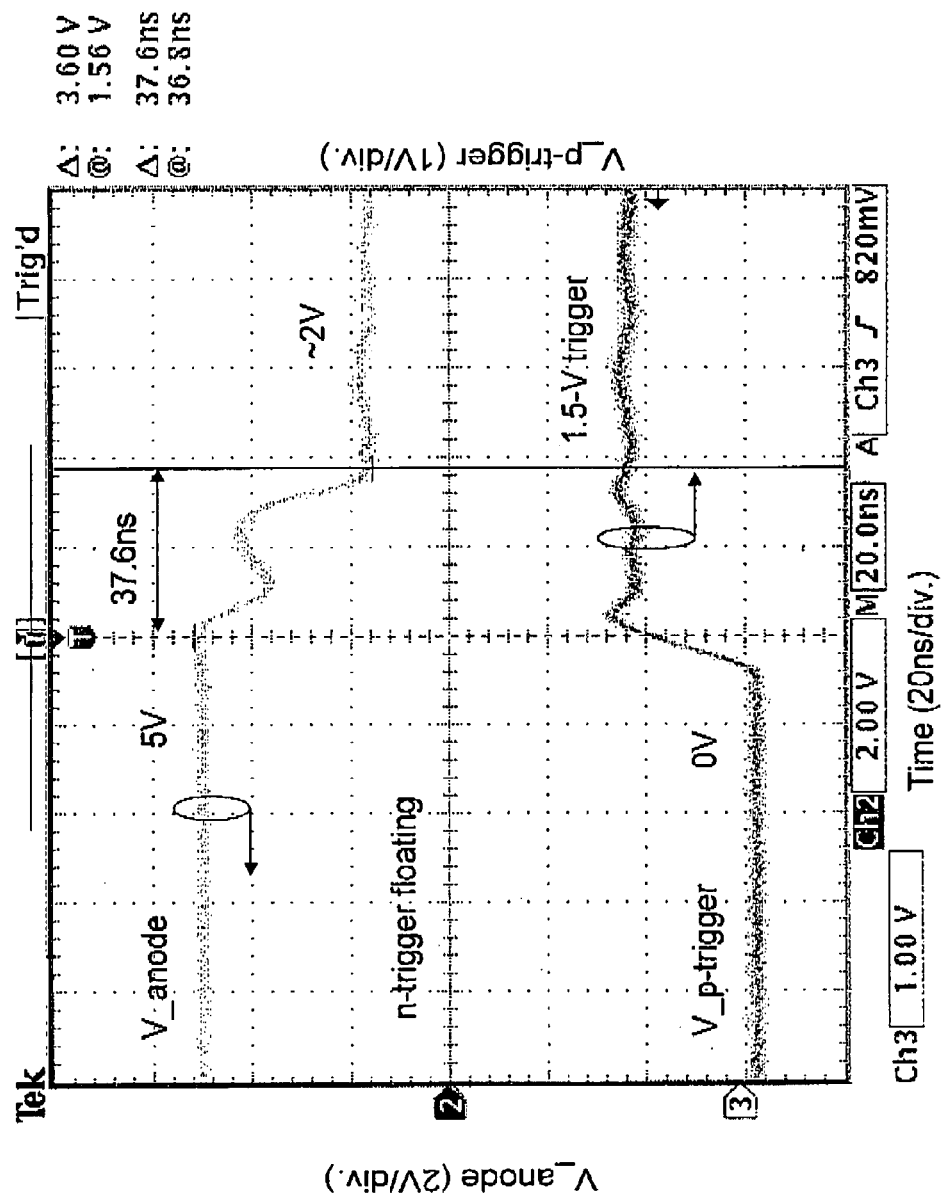
FIGS. 5F-5H are the V_anode at the falling edge while the DT_SCR is synchronously triggered by the 1.5-V positive voltage pulse and the negative voltage pulse of floating, 5V-to-2V, and 5V-to-0V, respectively.
Figure 5G:
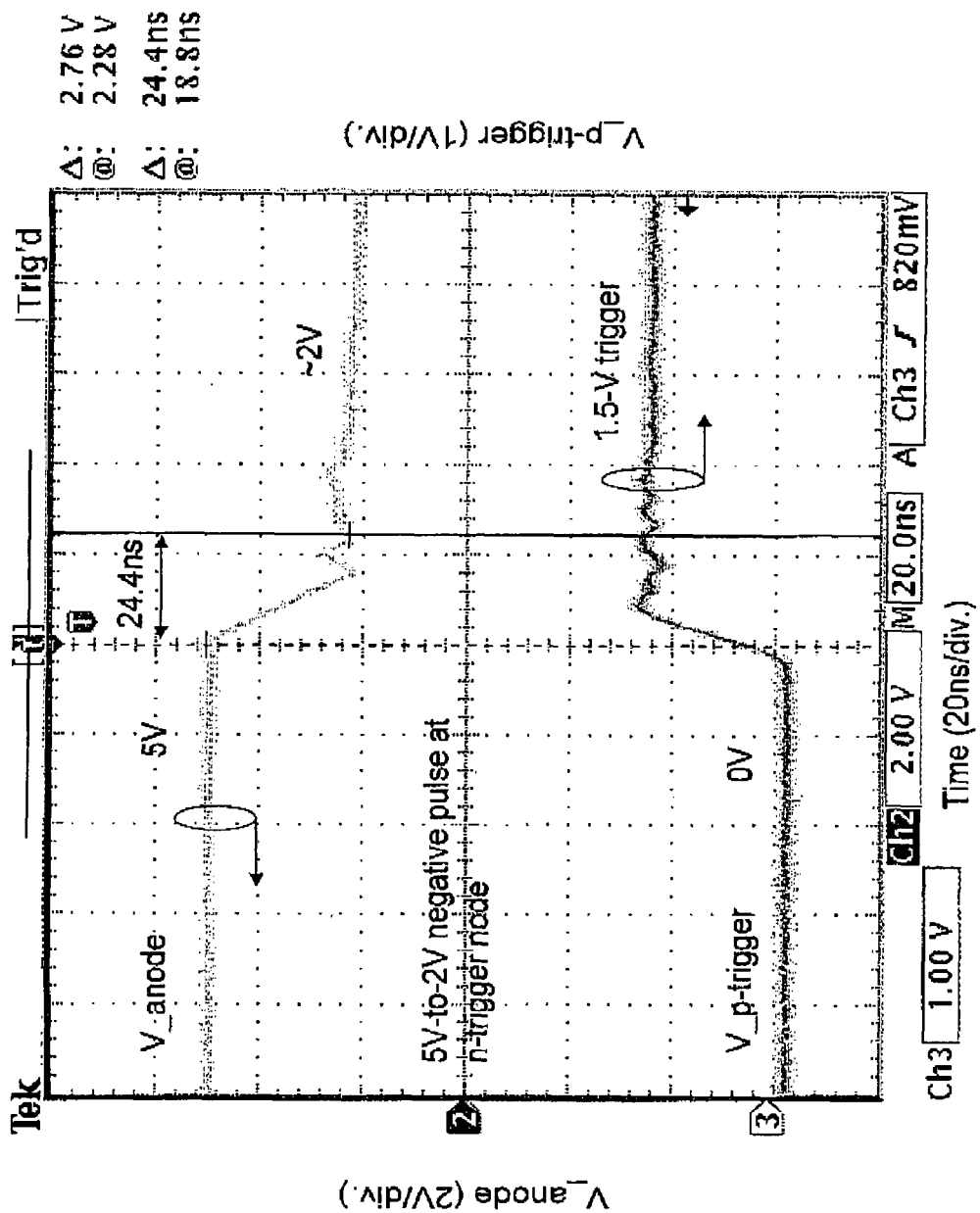
Figure 5H:
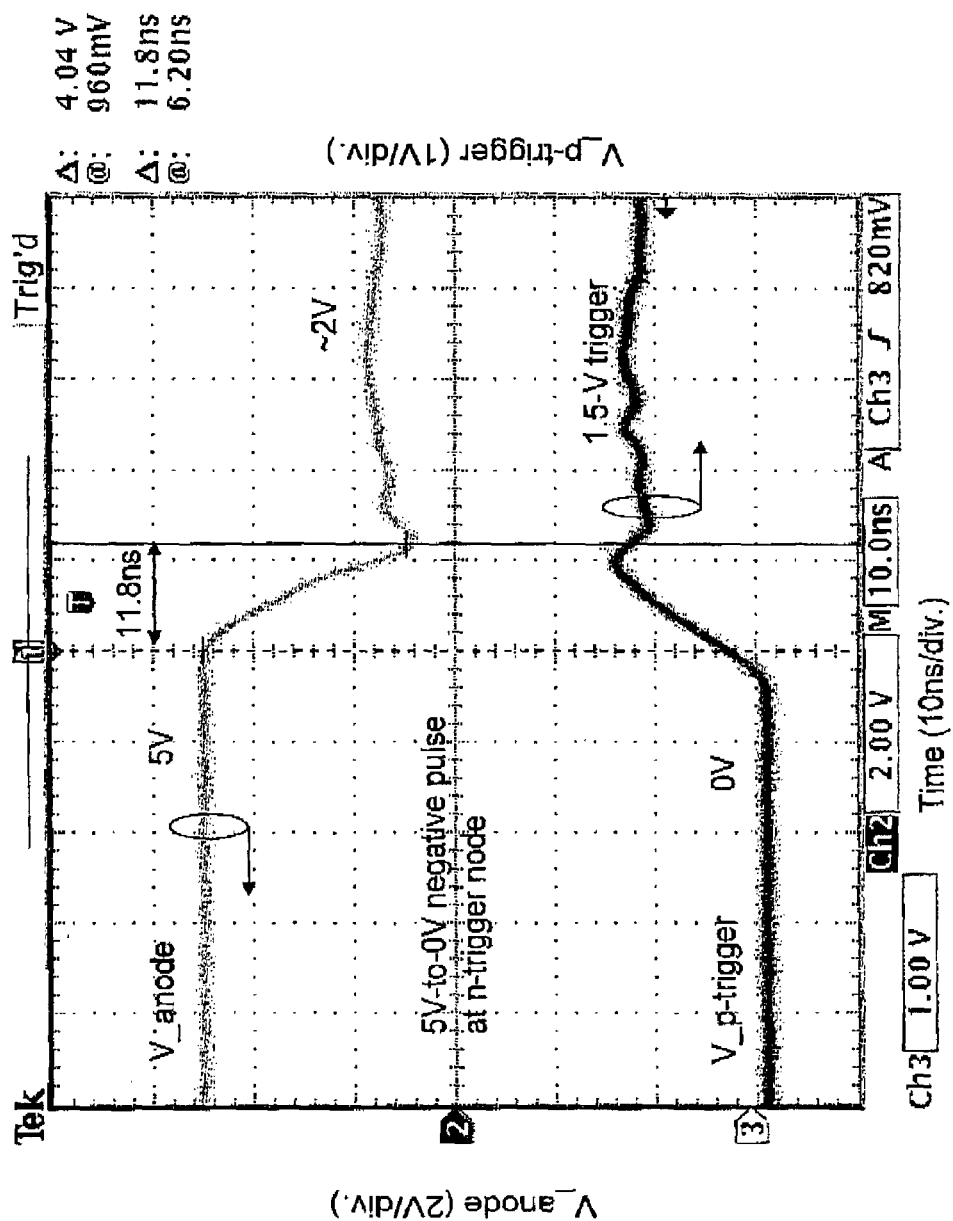

FIGS. 5F-5H are results measured at the V_anode at the falling edge while the DT_SCR is synchronously triggering by the 1.5-V positive voltage pulse and under the negative voltage pluse of floating, 5V-to-2V, and 5V-to-0V. In FIG. 5F, after the N-type trigger terminal is floating and the P-type trigger terminal is coupled with a 1.5-V positive pulse signal with 200 ns pulse width, the time to trigger double-triggered silicon controlling rectifier into latching state is 37.6 ns. It is the longer 30-ns pulse width shown in FIG. 5D, and is the reason why the double-triggered silicon controlling rectifier in FIG. 5D cannot be triggered into latching state.

Following the measurement of FIG. 5F, when negative-pulse signals from 5V-to-2V and 5V-to-0 V are coupled to the N-type trigger terminal in FIGS. 5G and 5H, the turn-on times are 24.4 ns and 11.8 ns, respectively. Obviously, the turn-on times are reduced. It means the double-triggered silicon controlling rectifier can be turned on faster for protecting the internal circuit of integrated circuit from ESD.

Figure 6A:
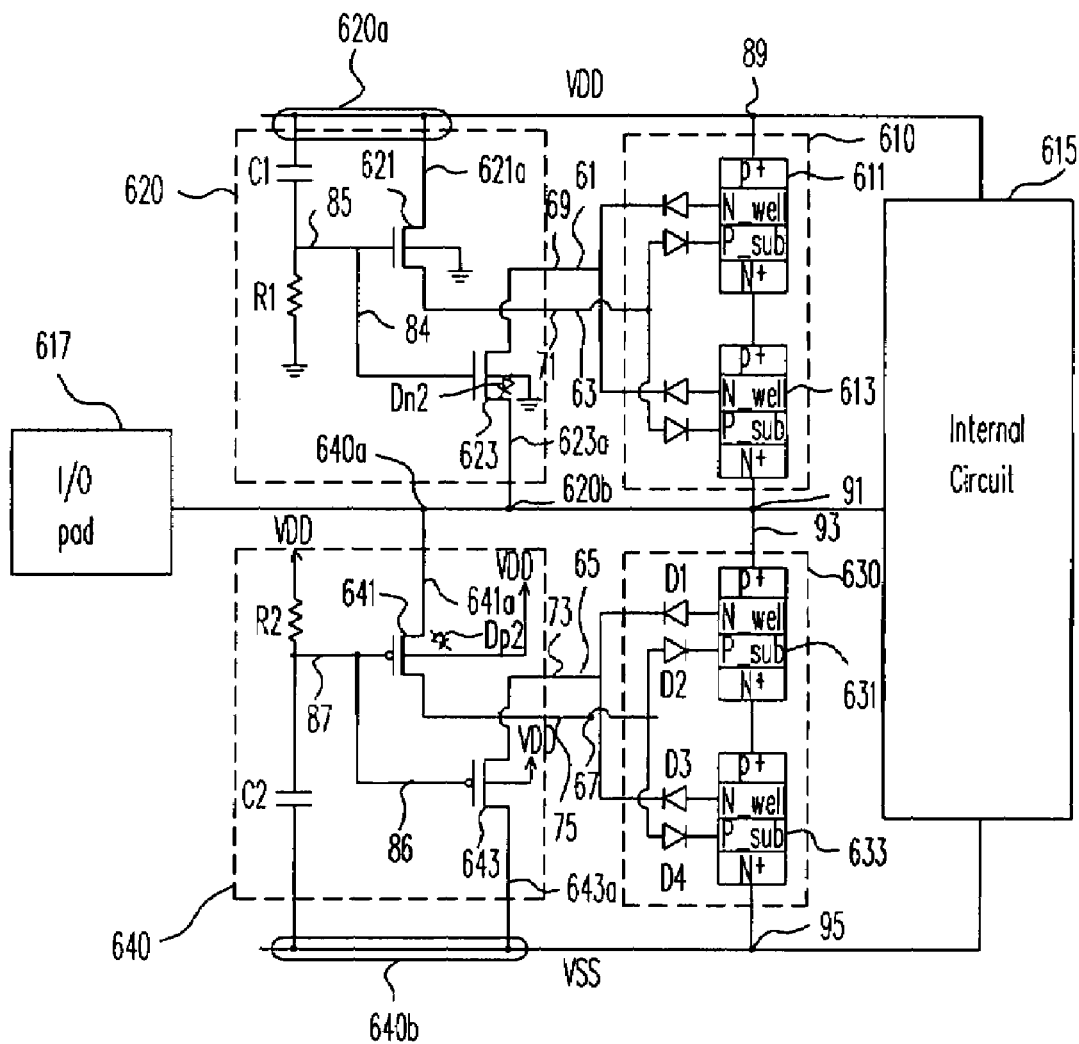
FIG. 6A is a configuration showing a preferred ESD protection circuit including the double-triggered silicon controlling rectifier of the present invention.

Following are the descriptions of the practical applications of the double-triggered silicon controlling rectifier of the present invention. FIG. 6A is a configuration showing a preferred ESD protection circuit using the double-triggered silicon controlling rectifier of the present invention. The ESD protection circuit comprises a first double-triggered silicon controlling rectifying module 610, a second double-triggered silicon controlling rectifying module 630, a first electrostatic detecting module 620 and a second electrostatic detecting module 640. The first terminal 89 of the first double-triggered silicon controlling rectifying module 610 is coupled to the external high-voltage terminal VDD. The second terminal 91 is coupled to the third terminal 93 of the second double-triggered silicon controlling rectifying module 630 and to the I/O pad 617 and the internal circuit 615 of the integrated circuit. The first N-type trigger terminal 61 is coupled to the first output terminal 69 of the first electrostatic detecting module 620. The first P-type trigger terminal 63 is coupled to the second output terminal 71 of the first electrostatic detecting module 620. In addition, the first input terminal 620a of the first electrostatic detecting module 620 is coupled to the external high-voltage terminal VDD. The second input terminal 620b is coupled to the I/O pad 617 and the internal circuit 615.

Referring to FIG. 6A, the fourth terminal 95 of the second double-triggered silicon controlling rectifying module 630 is coupled to the external low-voltage terminal VSS. The second N-type trigger terminal 65 is coupled to the third output terminal 73 of the second electrostatic detecting module 640. The second P-type trigger terminal 67 is coupled to the fourth output terminal 75 of the second electrostatic detecting module 640. The third input terminal 640a and the second input terminal 620b are coupled to each other, and the fourth input terminal 640b is coupled to the external low-voltage terminal VSS.

In addition, the first electrostatic detecting module 620 comprises a first transistor 621 and a second transistor 623, wherein the first source/drain terminal 621a is coupled to the first input terminal 620a, the second source/drain terminal serves as the second output terminal 71, and the gate terminal 85 is coupled to the first input terminal 620a through the capacitor C1 and to ground terminal through the resistor R1. The first source/drain terminal of the second transistor 623 serves as the first output terminal 69, the second source/drain terminal 623a is coupled to the second input terminal 620b, and the gate terminal 84 is coupled to the gate terminal 85 of the first transistor 621. In this embodiment, the first and the second transistors 621 and 623, respectively, are NMOS transistors, and the base terminals are grounded.

Referring to FIG. 6A, the second electrostatic detecting module 640 comprises a third transistor 641 and a fourth transistor 643, wherein the first source/drain terminal 641a is coupled to the third input terminal 640a, the second source/drain terminal serves as the second output terminal 75, and the gate terminal 87 is coupled to the external high-voltage terminal VDD through the resistor R2 and to the fourth input terminal 640b through the capacitor C2. The first source/drain terminal of the fourth transistor 643 serves as the third output terminal 73, the second source/drain terminal 643a is coupled to the fourth input terminal 640b, and the gate terminal 86 is coupled to the gate terminal 87 of the first transistor 621. In this embodiment, the first and the second transistors 641 and 643, respectively, are PMOS transistors, and the base terminals are coupled to the external high-voltage terminal VDD.

Figure 6B:
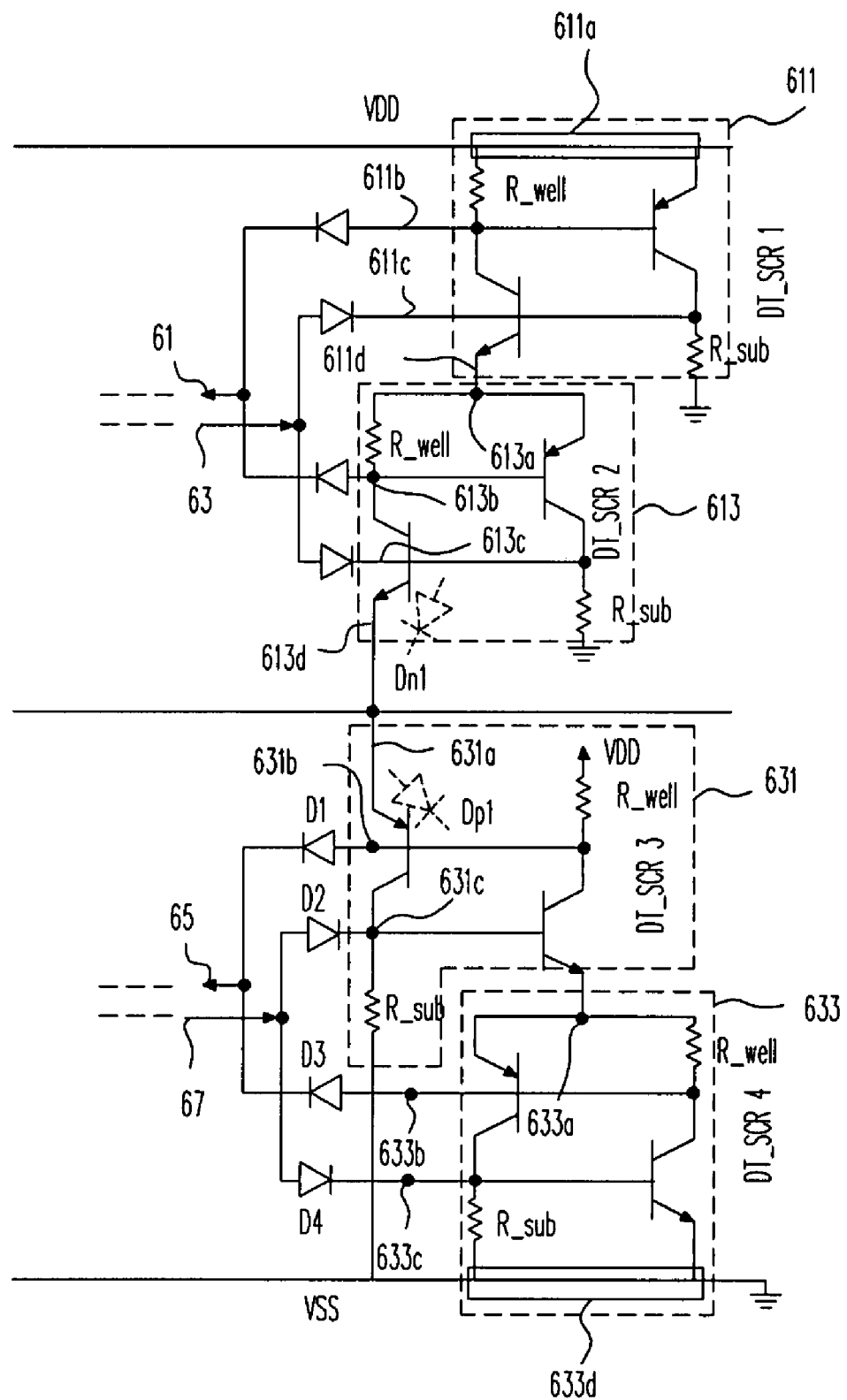
FIG. 6B is an equivalent circuit of the preferred first and second double-triggered silicon controlling rectifying modules of the present invention.

FIG. 6B is an equivalent circuit of the preferred first and second double-triggered silicon controlling rectifying modules of the present invention. Referring to FIG. 6B, the first double-triggered silicon controlling rectifying module 610 comprises a first double-triggered silicon controlling rectifier 611 and a second double-triggered silicon controlling rectifier 613. The cathode 611d of the first double-triggered silicon controlling rectifier 611 is coupled to the anode 613a of the second double-triggered silicon controlling rectifier 613. The anode 611a of the first double-triggered silicon controlling rectifier 611 serves as the first terminal 89. The cathode 613d of the second double-triggered silicon controlling rectifier 613 serves as the second terminal 91. The N-type trigger terminal 613b of the second double-triggered silicon controlling rectifier 613 is coupled to the N-type trigger terminal 611b of the first double-triggered silicon controlling rectifier 611 and serves as the first N-type trigger terminal 61. The P-type trigger terminal 613c of the second double-triggered silicon controlling rectifier 613 is coupled to the P-type trigger terminal 611c of the first double-triggered silicon controlling rectifier 611 and serves as the first P-type trigger terminal 63.

The second double-triggered silicon controlling rectifying module 630 comprises: a third double-triggered silicon controlling rectifier 631 and a fourth double-triggered silicon controlling rectifier 633. The anode 631d of the third double-triggered silicon controlling rectifier 631 is coupled to the cathode 633a of the fourth double-triggered silicon controlling rectifier 633. The anode 631a of the third double-triggered silicon controlling rectifier 631 serves as the third terminal 93. The cathode 633d of the fourth double-triggered silicon controlling rectifier 633 serves as the fourth terminal 95. The N-type trigger terminal 633b of the fourth double-triggered silicon controlling rectifier 633 is coupled to the N-type trigger terminal 631b of the third double-triggered silicon controlling rectifier 631 and serves as the second N-type trigger terminal 65. The P-type trigger terminal 633c of the fourth double-triggered silicon controlling rectifier 633 is coupled to the P-type trigger terminal 631c of the third double-triggered silicon controlling rectifier 631 and serves as the second P-type trigger terminal 67.

There are four situations when ESD pulses are discharged on integrated circuits: that the ESD pulse is a positive voltage and the external low-voltage terminal VSS is grounded (PS); that the ESD pulse is a negative voltage and the external low-voltage terminal VSS is grounded (NS); that the ESD pulse is a positive voltage and the external high-voltage terminal VDD is grounded (PD); and that the ESD pulse is a negative voltage and the external high-voltage terminal VDD is grounded (ND). Following are the descriptions of the operations of the ESD protection circuit of the present invention.

Referring to FIG. 6A, when a positive ESD voltage attacks the I/O pad 617 and if the ESD protection circuit is under PS-mode operation, the initial state of the ESD protection circuit is that the external low-voltage terminal VSS is grounded and the external high-voltage terminal VDD is floating. Because of the floating of the external high-voltage terminal VDD, the third transistor 641 and the fourth transistor 643 are turned on. Accordingly, the ESD current are introduced from the third terminal 75 of the third transistor 641 to the second double-triggered silicon controlling rectifying module 630, and the second double-triggered silicon controlling rectifying module 630 introduces the ESD current from the third output terminal 73 to the fourth transistor 643.

In other words, the third transistor 641 introduces some initial ESD current to the second P-type trigger terminal 67 of the second double-triggered silicon controlling rectifying module 630, through the diodes D2 and D4, and into the third double-triggered silicon controlling rectifier 631 and the fourth double-triggered silicon controlling rectifier 633. Meanwhile, the third double-triggered silicon controlling rectifier 631 and the fourth double-triggered silicon controlling rectifier 633 introduce some initial ESD current, through the diodes D1 and D3, to the second N-type trigger terminal 65 of the fourth transistor 643. The switching voltage of the second double-triggered silicon controlling rectifying module 630 is gradually reduced, and the second double-triggered silicon controlling rectifying module 630 is turned on quickly. Therefore, the ESD current attacking the I/O pad 617 is discharged through the second double-triggered silicon controlling rectifying module 630.

At the discharge moment, the parasitic diodes Dp1 and Dp2 are in forward-bias state. Therefore, the capacitor C2 is charged by the ESD current so that the first transistor 621 and the second transistor 643 are turned off. The time constant R2C2 should be modified to maintain the gate biases of the first transistor 641 and the second transistor 643 in low state.

Referring to FIG. 6A, when a positive ESD voltage attacks the I/O pad 617 and if the ESD protection circuit is under ND-mode operation, the initial state of the ESD protection circuit is that the external low-voltage terminal VSS is floating and the external high-voltage terminal VDD is grounded. The operation of the ND-mode circuit is similar to that of the PS-mode and therefore detail descriptions thereof are not repeated herein.

When the ESD protection circuit is under NS-mode or PD-mode operation, the parasitic diodes (Dn1 and Dn2) or (Dp1 and Dp2) shown in FIGS. 6A and 6B are in forward-bias state. Accordingly, the ESD current attacking the I/O pad 617 are discharged to the VDD or VSS.

The ESD protection circuit of the present invention, under normal operation, is in off-state. Unless ESD pulses attacks the I/O pad, the electrostatic detecting circuit is in off-state and does not trigger the double-triggered silicon controlling rectifying module whether the voltage of the I/O pad is high or low.

Figure 6C:
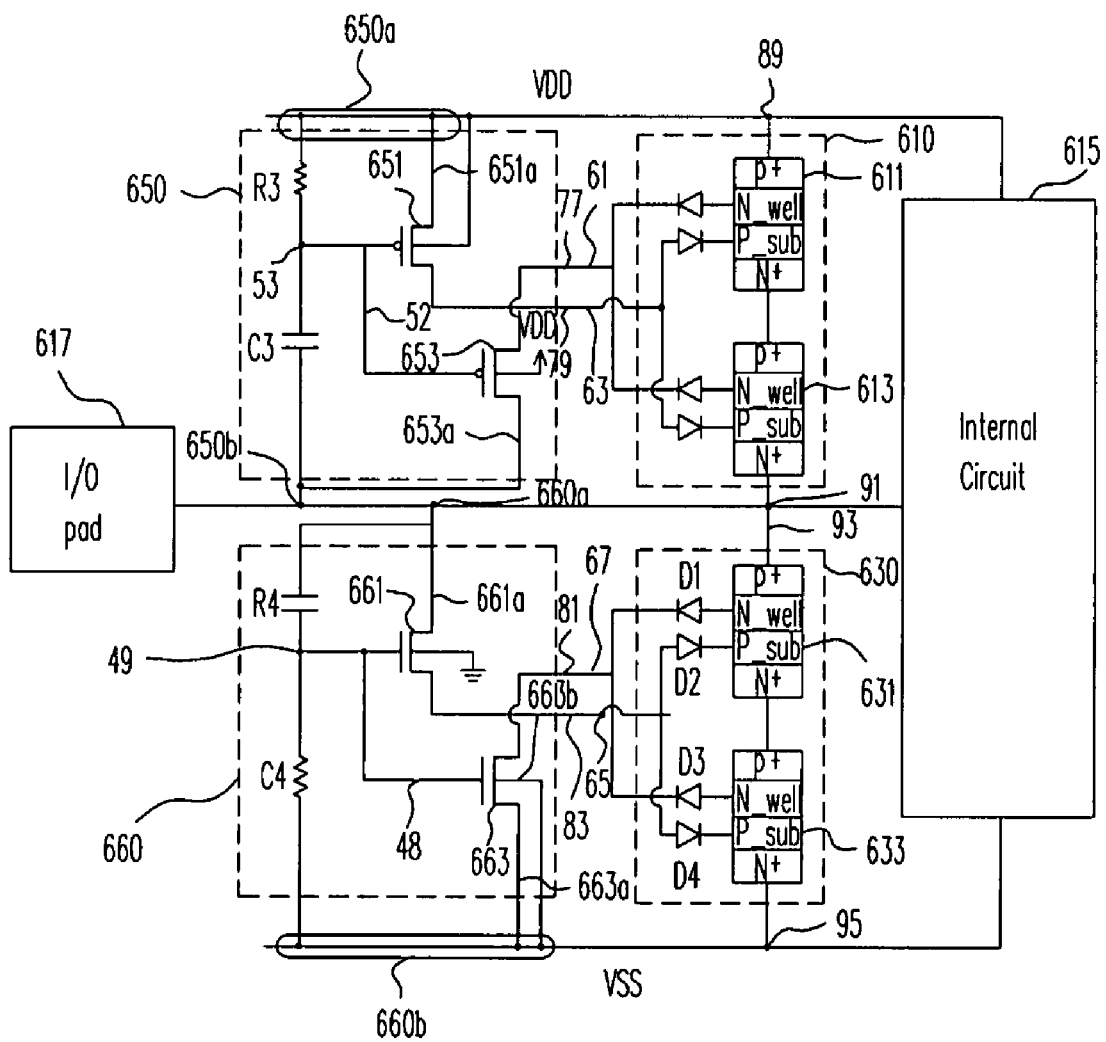
FIG. 6C is a configuration showing another preferred ESD protection circuit including the double-triggered silicon controlling rectifier of the present invention.

FIG. 6C is a configuration showing another preferred ESD protection circuit using the double-triggered silicon controlling rectifier of the present invention. Referring to FIG. 6C, the first and the second electrostatic detecting modules 620 and 640, respectively, of FIG. 6A are replaced by the first and the second electrostatic detecting modules 650 and 660, respectively. The connection of the first and the second electrostatic detecting modules 650 and 660, respectively, are similar to that of the last embodiment.

The first electrostatic detecting module 650 comprises: a first transistor 651 and a second transistor 653. The first source/drain terminal 651a of the first transistor 651 is coupled to the first input terminal 650a, the second source/drain terminal serves as the second output terminal 79 of the first transistor 650, and the gate terminal 53 is coupled to the first input terminal 650a through the resistor R3 and to the second output terminal 650b through the capacitor C3. The first source/drain terminal of the second transistor 653 serves as the first output terminal 77 of the first electrostatic detecting module 650, the second source/drain terminal 653a of the second transistor 653 is coupled to the second input terminal 650b, and the gate terminal 52 is coupled to the gate terminal 53 of the first transistor 651. In the embodiment, the first and the second transistors 651 and 653, respectively, are P-type transistors and the base terminals of the transistors are coupled to the first input terminal 650a.

Referring to FIG. 6C, the second electrostatic detecting module 660 comprises: a third transistor 661 and a fourth transistor 663. The first source/drain terminal 661a of the third transistor 661 is coupled to the third input terminal 660a, the second source/drain terminal serves as the fourth output terminal 81 of the second electrostatic detecting module 660, and the gate terminal 49 is coupled to the fourth input terminal 660b through the capacitor C4 and to the third terminal 660a through the resistor R4. The first source/drain terminal of the fourth transistor 663 serves as the third output terminal 83 of the second electrostatic detecting module 660, the second source/drain terminal 663a is coupled to the fourth input terminal 660b, and the gate terminal 48 is coupled to the gate terminal 49 of the third transistor 661. In the embodiment, the first and the second transistors 661 and 663, respectively, are N-type transistors, the base terminal of the third transistor 661 is grounded, and the base terminal 663b of the fourth transistor 663 is coupled to the external low-voltage terminal VSS. In the ESD protection circuit of this embodiment, the connection and operation of the embodiment are similar to those of the embodiment in FIG. 6A. Detail descriptions are not repeated.

Accordingly, the ESD protection circuit of the present invention is composed of double-triggered silicon controlling rectifiers. When ESD pulses attack the I/O pad, the double-triggered silicon controlling rectifier of the ESD protection circuit can protect of the gate oxide layer of the internal circuit against damage resulting from the ESD pulses.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. An electrostatic discharge (ESD) protection circuit using a double-triggered silicon controlling rectifier, fabricated in an integrate circuit and disposed between an input/output (I/O) pad and an internal circuit thereof, the ESD protection circuit comprising:

a first double-triggered silicon controlling rectifying module, having a first terminal, a second terminal, a N-type trigger terminal and a P-type trigger terminal, the first terminal coupled to a high-voltage external power terminal, the second terminal coupled to the I/O pad and the internal circuit of integrate circuit;

a first electrostatic detecting module, having a first output terminal, a second output terminal, a first input terminal and a second input terminal, the first output terminal coupled to the first N-type trigger terminal, the second output terminal coupled to the first P-type trigger terminal, the first input terminal coupled to the high-voltage external terminal, the second input terminal coupled to the internal circuit of the integrate circuit and the I/O pad, wherein when a negative ESD voltage attacks the I/O pad, the first double-triggered silicon controlling rectifying module directs ESD current from the first N-type trigger terminal to the first electrostatic detecting module and directs ESD current from the second output terminal to the first double-triggered silicon controlling rectifying module;

a second double-triggered silicon controlling rectifying module, having a third terminal, a fourth terminal, a second N-type trigger terminal and a second P-type trigger terminal, the third terminal coupled to the I/O pad and the internal circuit of the integrate circuit, the second terminal coupled to a low-voltage external power terminal; and a second electrostatic detecting module, having a third output terminal, a fourth output terminal, a third input terminal and a fourth input terminal, the third output terminal coupled to the second N-type trigger terminal, the fourth output terminal coupled to the second P-type trigger terminal, the third input terminal coupled to the internal circuit of the integrate circuit and the I/O pad, the fourth input pad coupled to the low-voltage external power terminal, wherein when a positive ESD voltage attacks the I/O pad, the second double-triggered silicon controlling rectifying module directs ESD current form the second N-type trigger terminal to the second electrostatic detecting module, and the directs ESD current from the fourth output terminal to the second double-triggered silicon controlling rectifying module.

2. The ESD protection circuit using a double-triggered silicon controlling rectifier of claim 1, wherein the first double-triggered silicon controlling rectifying module comprises:

a first double-triggered silicon controlling rectifier, having an anode, a cathode, N-type trigger terminal and the P-type trigger terminal, the anode of the first double-triggered silicon controlling rectifier serving as the first terminal; and a second double-triggered silicon controlling rectifier, having an anode, cathode, a N-type trigger terminal and a P-type trigger terminal, the anode of the second double-triggered silicon controlling rectifier coupled to the cathode of the first double-triggered silicon controlling rectifier, the cathode of the second double-triggered silicon controlling rectifier serving as the second terminal, the N-type trigger terminal of the second double-triggered silicon controlling rectifier coupled to the N-type trigger terminal of the first double-triggered silicon controlling rectifier serving as the first N-type trigger terminal, the P-type trigger terminal of the second double-triggered silicon controlling rectifier coupled to the P-type trigger terminal of the first double-triggered silicon controlling rectifier serving as the first P-type trigger terminal.

3. The ESD protection circuit using a double-triggered silicon controlling rectifier of claim 1, wherein the second double-triggered silicon controlling rectifying module comprises:
a third double-triggered silicon controlling rectifier, having an anode, a cathode, a N-type trigger terminal and a P-type trigger terminal, the anode of the third double-triggered silicon controlling rectifier serving as the third terminal; and
a fourth double-triggered silicon controlling rectifier, having an anode, cathode, a N-type trigger terminal and a P-type trigger terminal, the anode of the fourth double-triggered silicon controlling rectifier coupled to the cathode of the third double-triggered silicon controlling rectifier, the cathode of the fourth double-triggered silicon controlling rectifier serving as the fourth terminal, the N-type trigger terminal of the fourth double-triggered silicon controlling rectifier coupled to the N-type trigger terminal of the third double-triggered silicon controlling rectifier serving as the second N-type trigger terminal, the P-type trigger terminal of the fourth double-triggered silicon controlling rectifier coupled to the P-type trigger terminal of the third double-triggered silicon controlling rectifier serving as the second P-type trigger terminal.

4. The ESD protection circuit using a double-triggered silicon controlling rectifier of claim 1, wherein the first electrostatic detecting module comprises:
a first N-type transistor having a first source/drain terminal, a second source/drain terminal, a gate terminal and a base terminal, the first source/drain terminal of the first N-type transistor coupled to the first input terminal, the second source/drain terminal serving as the second output terminal of the first N-type transistor, the gate terminal of the first N-type transistor coupled to the first input terminal and grounded, the base terminal of the first N-type transistor grounded; and
a N-type transistor having a first source/drain terminal, a second source/drain terminal, a gate terminal and a base terminal, the first source/drain terminal of the second N-type transistor serving as the first output terminal, the second source/drain terminal of the second N-type transistor coupled to the second input terminal, the gate terminal of the second N-type transistor coupled to the gate terminal of the first N-type transistor, the base terminal of the second N-type transistor grounded.

5. The ESD protection circuit using a double-triggered silicon controlling rectifier of claim 1, wherein the first electrostatic detecting module comprises:
a first P-type transistor having a first source/drain terminal, a second source/drain terminal, a gate terminal and a base terminal, the first source/drain terminal of the first P-type transistor coupled to the first input terminal, the second source/drain terminal of the first P-type transistor serving as the second output terminal, the gate terminal of the first P-type transistor coupled to the first input terminal and the second input terminal, the base terminal of the first P-type transistor coupled to the first input terminal; and
a second P-type transistor having a first source/drain terminal, a second source/drain terminal, a gate terminal and a base terminal, the first source/drain terminal of the second P-type transistor serving as the first output terminal, the second source/drain terminal of the second P-type transistor coupled to the second input terminal, the gate terminal of the second P-type transistor coupled to the gate terminal of the first P-type transistor, the base terminal of the second P-type transistor coupled to the first input terminal.

6. The ESD protection circuit using a double-triggered silicon controlling rectifier of claim 1, wherein the second electrostatic detecting module comprises:
a third P-type transistor having a first source/drain terminal, a second source/drain terminal, a gate terminal and a base terminal, the first source/drain terminal of the third P-type transistor coupled to the third input terminal, the second source/drain terminal of the third P-type transistor as the fourth output terminal, the gate terminal of the third P-type transistor coupled to the high-voltage external power terminal and the fourth input terminal, the base terminal of the third P-type transistor coupled to the high-voltage external power terminal; and
a fourth P-type transistor having a first source/drain terminal, a second source/drain terminal, a gate terminal and a base terminal, the first source/drain terminal of the fourth P-type transistor as the third output terminal, the second source/drain terminal of the fourth P-type transistor coupled to the fourth input terminal, the gate terminal of the fourth P-type transistor coupled to the gate terminal of the third P-type transistor, the base terminal of the fourth P-type transistor coupled to the high-voltage external power terminal.

7. The ESD protection circuit using a double-triggered silicon controlling rectifier of claim 1, wherein the second electrostatic detecting module comprises:
a third N-type transistor having a first source/drain terminal, a second source/drain terminal, a gate terminal and a base terminal, the first source/drain terminal of the third N-type transistor coupled to the third input terminal, the second source/drain terminal of the third P-type transistor serving as the fourth output terminal, the gate terminal of the third P-type transistor coupled to the third input terminal and the fourth input terminal, the base terminal of the third N-type transistor grounded; and
a fourth N-type transistor having a first source/drain terminal, a second source/drain terminal, a gate terminal and a base terminal, the first source/drain terminal of the fourth N-type transistor serving as the third output terminal, the second source/drain terminal of the fourth N-type transistor coupled to the fourth input terminal, the gate terminal of the fourth N-type transistor coupled to the gate terminal of the third N-type transistor, the base terminal of the fourth N-type transistor coupled to the fourth input terminal.

* * * * *